(12) United States Patent
Smith et al.

(10) Patent No.: US 9,685,921 B2
(45) Date of Patent: Jun. 20, 2017

(54) LOUDNESS CONTROL WITH NOISE DETECTION AND LOUDNESS DROP DETECTION

(71) Applicant: DTS, Inc., Calabasas, CA (US)

(72) Inventors: Brandon Smith, Kirkland, WA (US); Aaron Warner, Seattle, WA (US); Jeff Thompson, Bothell, WA (US)

(73) Assignee: DTS, INC., Calabasas, CA (US)

( * ) Notice: Subject to any disclaimer, the term of this patent is extended or adjusted under 35 U.S.C. 154(b) by 599 days.

(21) Appl. No.: 13/838,697

(22) Filed: Mar. 15, 2013

(65) Prior Publication Data

US 2014/0016791 A1    Jan. 16, 2014

Related U.S. Application Data

(60) Provisional application No. 61/671,005, filed on Jul. 12, 2012, provisional application No. 61/670,991, filed on Jul. 12, 2012.

(51) Int. Cl.
*H03G 3/20* (2006.01)
*H03G 3/32* (2006.01)
(Continued)

(52) U.S. Cl.
CPC .............. *H03G 3/20* (2013.01); *H03G 3/32* (2013.01); *H03G 5/005* (2013.01); *H03G 9/005* (2013.01); *H03G 9/025* (2013.01)

(58) Field of Classification Search
None
See application file for complete search history.

(56) References Cited

U.S. PATENT DOCUMENTS 5,682,463 A     10/1997   Allen et al.
6,415,253 B1 *  7/2002    Johnson ............. G10L 21/0208
                                                    381/94.2
(Continued)

FOREIGN PATENT DOCUMENTS

CN          102195581 A        9/2011

OTHER PUBLICATIONS

International Search Report and Written Opinion of the International Searching Authority mailed Feb. 20, 2014, for PCT Application No. PCT/US2013/050207 filed Jul. 12, 2013, 15 pages.

(Continued)

*Primary Examiner* — Curtis Kuntz
*Assistant Examiner* — Kenny Truong
(74) *Attorney, Agent, or Firm* — Volpe and Koenig, P.C.

(57) ABSTRACT

Loudness control systems or methods may normalize audio signals to a predetermined loudness level. If the audio signal includes moderate background noise, then the background noise may also be normalized to the target loudness level. Noise signals may be detected using content-versus-noise classification, and a loudness control system or method may be adjusted based on the detection of noise. Noise signals may be detected by signal analysis in the frequency domain or in the time domain. Loudness control systems may also produce undesirable audio effects when content shifts from a high overall loudness level to a lower overall loudness level. Such loudness drops may be detected, and the loudness control system may be adjusted to minimize the undesirable effects during the transition between loudness levels.

16 Claims, 12 Drawing Sheets

(51) Int. Cl.
  *H03G 9/02* (2006.01)
  *H03G 9/00* (2006.01)
  *H03G 5/00* (2006.01)

(56) References Cited

U.S. PATENT DOCUMENTS

| | | | |
|---|---|---|---|
| 7,039,204 B2 * | 5/2006 | Baumgarte | G10L 15/22 |
| | | | 381/103 |
| 7,212,640 B2 | 5/2007 | Bizjak | |
| 7,333,618 B2 | 2/2008 | Shuttleworth et al. | |
| 7,343,019 B2 | 3/2008 | Hankins et al. | |
| 7,353,169 B1 | 4/2008 | Goodwin et al. | |
| 8,144,881 B2 | 3/2012 | Crockett et al. | |
| 2004/0122662 A1 | 6/2004 | Crockett | |
| 2005/0063552 A1 * | 3/2005 | Shuttleworth | H03G 3/32 |
| | | | 381/57 |
| 2006/0025994 A1 | 2/2006 | Christoph | |
| 2007/0291959 A1 * | 12/2007 | Seefeldt | H03G 3/32 |
| | | | 381/104 |
| 2008/0310652 A1 | 12/2008 | Gustavsson | |
| 2009/0154726 A1 * | 6/2009 | Taenzer | G10L 25/78 |
| | | | 381/94.1 |
| 2009/0161883 A1 | 6/2009 | Katsianos | |
| 2009/0274322 A1 | 11/2009 | Chang et al. | |
| 2009/0304191 A1 * | 12/2009 | Hoang Co Thuy | G10L 21/0208 |
| | | | 381/57 |
| 2010/0208918 A1 | 8/2010 | Noguchi | |
| 2011/0002481 A1 | 1/2011 | Suzuki | |
| 2011/0038490 A1 | 2/2011 | Yang et al. | |
| 2011/0150242 A1 | 6/2011 | Zong et al. | |
| 2011/0228953 A1 | 9/2011 | Hess | |
| 2011/0320210 A1 * | 12/2011 | Vickers | H04R 3/04 |
| | | | 704/500 |
| 2012/0039490 A1 | 2/2012 | Smithers | |

OTHER PUBLICATIONS

International Preliminary Report on Patentability mailed Dec. 24, 2014, for PCT Application No. PCT/US2013/050207 filed Jul. 12, 2013, with Replacement Sheets, 22 pages.
ATSC Document A/85, "ATSC Recommended Practice: Techniques for Establishing and Maintaining Audio Loudness for Digital Television," (2011).
EBU—Recommendation R 128, "Loudness normalisation and permitted maximum level of audio signals," (2011).
IEC 61672-1, "Electroacoustics—Sound level meters," (May 2002).
Jones et al., "A New Loudness Indicator for Use in Broadcasting," Society of Motion Picture and Television Engineers, pp. 772-777 (1981).
Kupfmuller, "On the Dynamics of Automatic Gain Controllers," Elektrische Nachrichtentechnik, vol. 5, No. 11, pp. 459-467 (1928).
McNally, "Dynamic Range Control of Digital Audio Signals," J. Audio Eng. Soc. vol. 32, No. 5, pp. 316-327 (May 1984).
Recommendation ITU-R BS.1770, "Algorithms to measure audio programme loudness and true-peak audio level," (2006).
Office Action, Chinese Application No. 201380037168.3, dated Sep. 5, 2016.

* cited by examiner

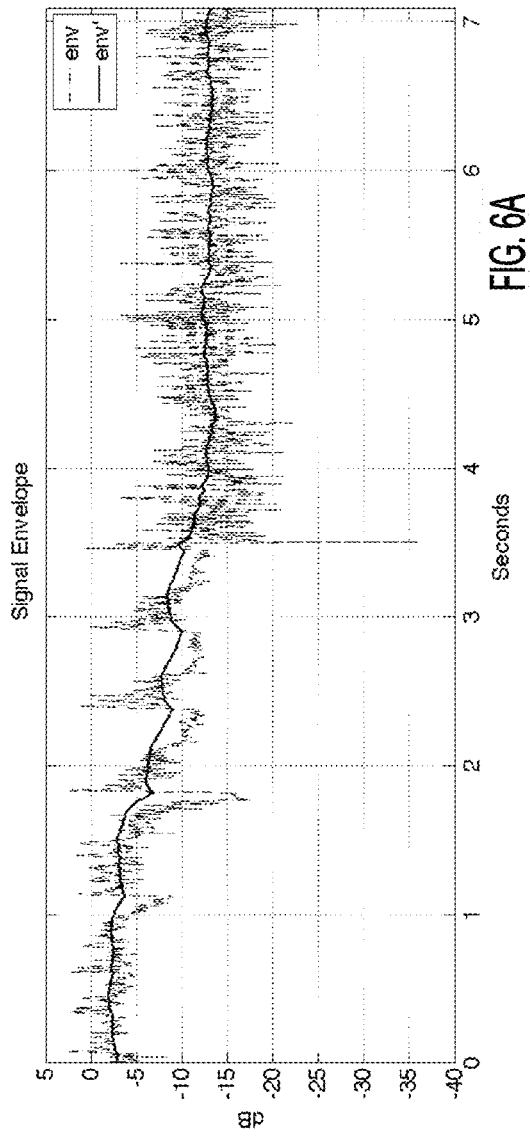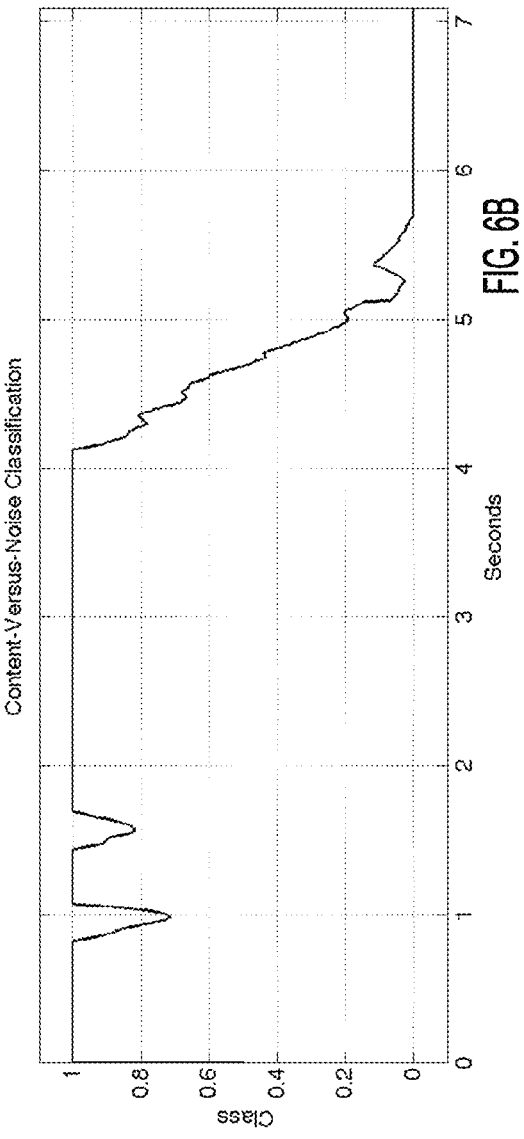

LOUDNESS CONTROL WITH NOISE DETECTION AND LOUDNESS DROP DETECTION

CROSS REFERENCE TO RELATED APPLICATIONS

This application claims the benefit of U.S. Provisional Application No. 61/670,991, filed Jul. 12, 2012 and U.S. Provisional Application No. 61/671,005, filed Jul. 12, 2012, which are incorporated by reference as if fully set forth.

FIELD OF INVENTION

This application relates to loudness control systems.

BACKGROUND

Loudness control systems may be designed to generate an output audio signal with a uniform loudness level from an input audio signal with varying loudness levels. These systems may be used in applications such as audio broadcast chains and in audio playback devices where multiple content sources of varying loudness levels are available. An example goal of the loudness control system may be to automatically provide an output signal with a uniform average loudness level, eliminating the need for a listener to continually adjust the volume control of their playback device.

Related to loudness control systems are automatic gain control (AGC) and dynamic range control (DRC) systems. AGC systems were a precursor to modern loudness control systems and have a long history in communication and broadcast applications, where many early designs were implemented as analog circuits. AGC systems may operate by multiplying an input signal with a time-varying gain signal, where the gain signal is controlled such that an objective measure of the output signal is normalized to a predetermined target level. Objective measures such as, for example, root-mean-square (RMS), peak, amplitude, or energy measures may be used. One drawback of existing AGC designs is that the perceived loudness of the output signal may remain unpredictable. This is due to the psychoacoustic phenomenon that perceived loudness is a subjective measure that only roughly correlates with objective measures such as RMS, peak, amplitude, or energy levels. Thus, while an AGC may adequately control the RMS value of an output signal, it does not necessarily result in the perceived loudness being uniform.

DRC systems are also related to loudness control systems, but with a slightly different goal. A DRC system assumes that the long-term average level of a signal is already normalized to an expected level and attempts to modify only the short-term dynamics. A DRC system may compress the dynamics so that loud events are attenuated and quiet events are amplified. This differs from the goal of a loudness control system to normalize the average loudness level of a signal while preserving the short-term signal dynamics.

Modern loudness control systems attempt to improve upon AGC and DRC designs by incorporating knowledge from the fields of psychoacoustics and loudness perception. Loudness control systems may operate by estimating the perceived loudness of an input signal and controlling the time-varying gain such that the average loudness level of the output signal may be normalized to a predetermined target loudness level.

A problem with existing loudness control systems is that there is no distinction made between desired content and unwanted noise, such that all low-level audio content above a predetermined threshold is amplified. A common problematic signal for existing loudness control systems is speech with moderate background noise. If there is a long pause in the speech, the loudness control system may begin to amplify the background noise. The resulting reduction of the signal-to-noise ratio (SNR) may be objectionable to some listeners. It would be desirable for the loudness control system to avoid relative amplification of noise levels, thus preserving the SNR of the input signal.

Another challenging scenario for loudness control systems is maintaining a uniform average loudness level without adversely limiting intra-content short-term signal dynamics. A system that reacts quickly to loudness changes may consistently achieve a desired target level, but at the expense of reduced short-term signal dynamics. On the other hand, a system that reacts slowly to loudness changes may not effectively control the loudness level, or may exhibit noticeable artifacts such as ramping during large changes in the input signal loudness level. Large long-term loudness changes are most common during inter-content transitions, such as a program transition or a content source change. It would be desirable to address both inter- and intra-content fluctuations differently within a loudness control system such that intra-content short-term signal dynamics are preserved while large inter-content loudness transitions are quickly controlled.

SUMMARY

Loudness control systems and methods may normalize audio content to a predetermined loudness level. If the audio content includes moderate background noise, then the background noise may also be normalized to the target loudness level. Noise signals may be detected using content-versus-noise classification, and a loudness control system or method may be adjusted based on the detection of noise to preserve the SNR of the input signal. Noise signals may be detected by signal analysis in the frequency domain or in the time domain. Loudness control systems may also produce undesirable audio artifacts when content transitions from a high long-term loudness level to a lower long-term loudness level. Such loudness drops may be detected, and the loudness control system may be adjusted to minimize the undesirable artifacts during the transition between loudness levels.

According to an embodiment, a loudness control system may be configured to process an audio signal. The loudness control system may comprise a loudness measurement module configured to generate a short-term loudness estimate of the audio signal. The loudness control system may further comprise a noise detection module configured to produce a content-versus-noise classification of the audio signal. The loudness control system may further comprise a temporal smoothing module configured to adjust at least one smoothing factor based on the content-versus-noise classification result and generate a long-term loudness estimate of the audio signal based on the short-term loudness estimate using the at least one smoothing factor. The loudness control system may further comprise a gain correction module configured to apply a time-varying gain to the audio signal based on the long-term loudness estimate. The noise detection module may be configured to use frequency domain noise detection or time domain noise detection to produce the content-versus-noise classification result. The at least one smoothing factor may include a release smoothing factor that controls a speed at which the gain correction module can increase a gain level. The content-versus-noise classification may be normalized over a range [0,1]. The loudness control system may further comprise a loudness drop detection module configured to generate a loudness drop detection value, where the temporal smoothing module may be further configured to adjust the at least one smoothing factor based on loudness drop detection value.

According to another embodiment, a loudness control system may be configured to process an audio signal. The loudness control system may comprise a loudness measurement module configured to generate a short-term loudness estimate of the audio signal. The loudness control system may further comprise a loudness drop detection module configured to generate a loudness drop detection value. The loudness control system may further comprise a temporal smoothing module configured to adjust at least one smoothing factor based on the loudness drop detection value and generate a long-term loudness estimate of the audio signal based on the short-term loudness estimate using the at least one smoothing factor. The loudness control system may further comprise a gain correction module configured to apply a time-varying gain to the audio signal based on the long-term loudness estimate. The at least one smoothing factor may include a release smoothing factor that controls a speed at which the gain correction module can increase a gain level. The loudness drop detection value may be normalized over a range [0,1]. The loudness control system may further comprise a noise detection module configured to produce a content-versus-noise classification of the audio signal, where the temporal smoothing module may be further configured to adjust the at least one smoothing factor based on the content-versus-noise classification.

According to another embodiment, a system may be configured to perform frequency domain noise detection. The system may comprise a summing component configured to receive an input signal including a plurality of channels and to generate a mono signal by summing the plurality of channels. The system may further comprise a short-time Fourier transform (STFT) component configured to generate a frequency domain signal by applying a STFT to the mono signal. The system may further comprise a decibel converter configured to generate a power spectrum based on the frequency domain signal and convert the power spectrum to the decibel (dB) domain. The system may further comprise a temporal smoothing component configured to generate a time-smoothed power spectrum by estimating temporal averages of energy of each frequency band of the power spectrum. The system may further comprise a spectral flux measurement component configured to calculate a spectral flux value of the power spectrum by calculating a mean difference of the power spectrum and the time-smoothed power spectrum. The system may further comprise a peakiness measurement component configured to generate a peakiness value by estimating tonal characteristic of each sub-band of the power spectrum by measuring the relative energy of a sub-band compared to its neighbors. The system may further comprise a signal-to-noise (SNR) estimator component configured to estimate a noise power spectrum based on the spectral flux value of the power spectrum, the peakiness value and the power spectrum, and generate a signal-to-noise ratio (SNR). The system may further comprise a temporal smoothing component configured to generate a smoothed SNR based on the SNR. The system may further comprise a hysteresis component configured to generate a content-versus-noise classification value for the input signal based on the SNR. The SNR estimator component may be configured to estimate the noise power spectrum of the signal by removing any temporal dynamics or tonal components from an original spectrum of the signal that are assumed to be components of desired content. The content-versus-noise classification may be normalized over a range [0,1]. The signal-to-noise estimator component may be configured to calculate a wide-band noise level and a signal level. The system may be comprised in a loudness control system, wherein the loudness control system may include a temporal smoothing component configured to adjust gain correction speeds based on the content-versus-noise classification value.

According to another embodiment, a system may be configured to perform time domain noise detection. The system may comprise a summing component configured to receive an input signal including a plurality of channels and to generate a mono signal by summing the plurality of channels. The system may further comprise a root-mean-square (RMS) component configured to convert the mono signal into a short-term envelope estimate. The system may further comprise a decibel converter configured to perform decibel (dB) conversion on the short-term envelope estimate. The system may further comprise a smoothing filter configured to take an average of the short-term envelope estimate to generate a long-term mean envelope estimate. The system may further comprise a subtraction component configured to subtract the long-term mean envelope estimate from the short-term envelope estimate to generate an envelope value. The system may further comprise a half-wave rectifier component configured to half-wave rectify the envelope value. The system may further comprise at least two smoothing filters configured to estimate a mean of an onset energy and a mean of an offset energy based on the envelope value. The system may further comprise a normalized error calculator configured to calculate a normalized squared error between the mean of the onset energy and the mean of the offset energy. The system may further comprise a temporal smoothing component configured to temporally smooth the normalized squared error. The system may further comprise a hysteresis component configured to apply a hysteresis to the smoothed normalized squared error to generate a content-versus-noise classification. The smoothing filter may be configured to take an exponential moving average (EMA) of the short-term envelope estimate. The temporal smoothing component uses a smoothing factor that is signal-dependent. The smoothing factor has differing attack and release characteristics. The content-versus-noise classification is normalized over a range [0,1]. The system of claim may be comprised in a loudness control system, wherein the loudness control system may include a temporal smoothing component configured to adjust gain correction speeds based on the content-versus-noise classification value.

According to another embodiment, a system may be configured to perform loudness drop detection. The system may comprise a short-term loudness measurement module configured to receive an input signal and to calculate a short-term loudness estimate based on the input signal. The system may further comprise at least two temporal smoothing filters configured to calculate a slow smoothed loudness estimate and a fast smoothed loudness estimate. The system may further comprise a subtraction module configured to subtract the fast smoothed loudness estimate from the slow smoothed loudness estimate to generate a difference value. The system may further comprise a half-wave rectifier module configured to half-wave rectify the difference value to generate a rectified difference value. The system may further comprise a normalization module configured to normalize the rectified difference value to generate a drop detection value. The short-term loudness measurement module may be configured to use an ITU-R BS.1770 loudness measure to calculate the short-term loudness estimate. The at least two temporal smoothing filters may be configured to use a slow smoothing factor and fast smoothing factor, respectively, wherein the slow and fast smoothing factors are dynamically modified based on dynamics of the input signal. The slow smoothing factor and the fast smoothing factor may be mutually slowed down for input signals with high measures of signal dynamics. The slow smoothing factor and the fast smoothing factor may be mutually sped up for input signals with low measures of signal dynamics. The normalization module may use translation, scaling, and saturation to calculate the drop detection value. The normalization module may be configured to generate the drop detection value in a range from [0,1], wherein the drop detection value of one indicates a loudness drop was detected and the drop detection value of zero indicates that no drop was detected. The system may be comprised in a loudness control system, where the loudness control system may include a temporal smoothing component configured to adjust gain correction speeds based on the drop detection value.

BRIEF DESCRIPTION OF THE DRAWINGS

FIG. 6A shows a signal envelope and a smoothed signal envelope over a content-to-noise transition;

FIG. 6B shows an example classification output from a time domain noise detection system corresponding to the signal in FIG. 6A;

DETAILED DESCRIPTION

A sound wave is a type of pressure wave caused by the vibration of an object that propagates through a compressible medium such as air. A sound wave periodically displaces matter in the medium (e.g. air) causing the matter to oscillate. The frequency of the sound wave describes the number of complete cycles within a period of time and is expressed in Hertz (Hz). Sound waves in the 12 Hz to 20,000 Hz frequency range are audible to humans.

Figure 1:
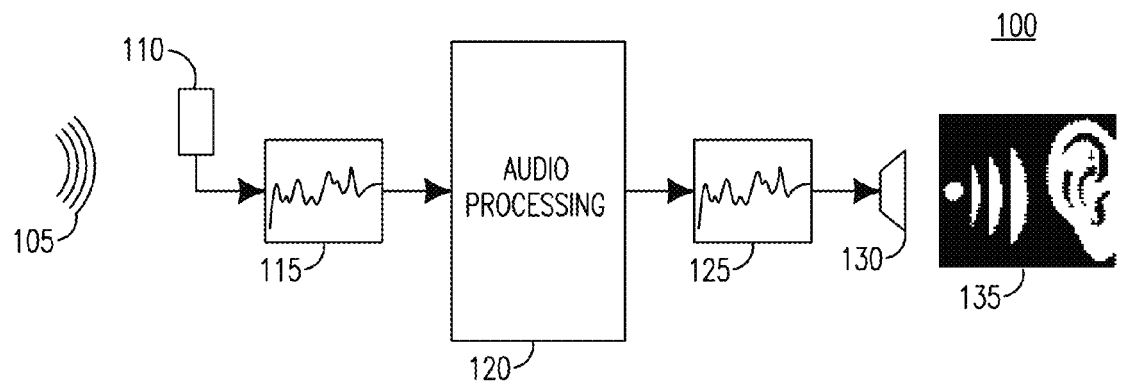
FIG. 1 shows a block diagram of input sound waves passing through an audio processing system to produce output sound waves.

FIG. 1 shows a flow diagram 100 of input sound waves 105 passing through an audio processing system to produce output sound waves 135. An audio signal is a representation of an audible sound wave as an electrical voltage. A device 110 such as, for example, a microphone, receives and converts sound pressure waves, which are mechanical energy, into electrical energy or audio signals 115. Similarly, a device 130, such as a loudspeaker or headphones, converts an electrical audio signal 125 into an audible sound wave 135. Audio signal processing block 120 is the intentional manipulation of audio signals 115 to alter the audible effect of the audio signal. Audio signal processing may be performed in the analog or digital domains.

An analog audio signal is represented by a continuous stream of data, for example along an electrical circuit in the form of voltage, current, or charge changes. Analog signal processing (ASP) physically alters the continuous signal by changing the voltage or current or charge via various electrical means. A digital audio signal is created through the sampling of an analog audio signal, where the signal is represented as a sequence of symbols, typically binary numbers, permitting the use of digital circuits such as microprocessors and computers for signal processing. In this case, processing is performed on the digital representation of the signal. Loudness control is an example of audio signal processing.

The embodiments described herein are described with respect to loudness control systems and methods applied to audio signals, however it is assumed that the concepts and enhancements may apply similarly to other audio signal processing systems, for example AGC and DRC systems and methods. Loudness control systems may serve to manipulate an input audio signal with varying loudness levels, to produce an output audio signal with a uniform loudness level that is more pleasing to the listener.

Some notational conventions are used throughout the embodiments described herein. It may be assumed that a signal $x[n]$ is a time series with sample index n and sample rate $Fs_n$. The signal $x[n]$ may consist of multiple audio channels C and may be notated as $x_c[n]$ to specify particular channels where c is a channel index $0 \le c \le C-1$. A signal $x[m]$ may be a time series that has been down-sampled by a factor of M such that the sample rate of $x[m]$ is $Fs_m = Fs_n/M$.

Figure 2:
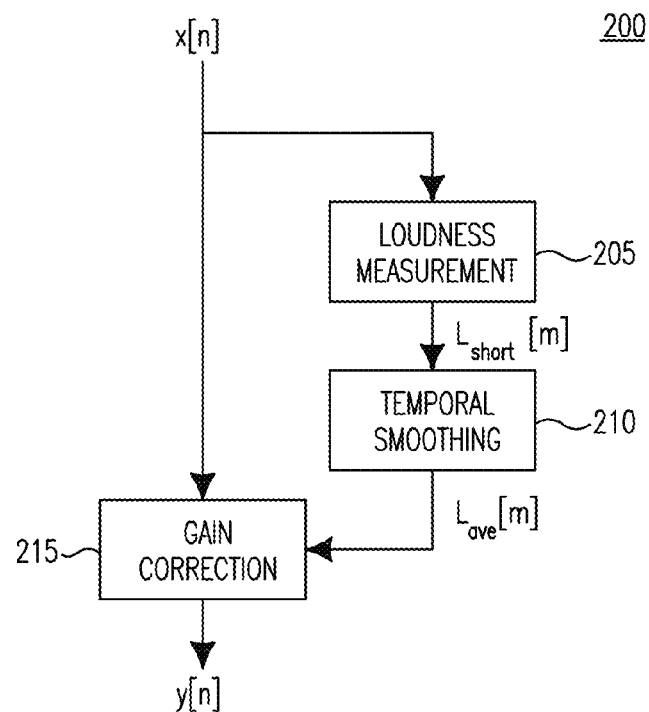
FIG. 2 shows a block diagram of a loudness control system.

A high-level block diagram of a loudness control system 200 is shown in FIG. 2. A loudness control system 200 may include at least the following three core modules: a loudness measurement module 205, a temporal smoothing module 210, and a gain correction module 215. The loudness control system 200 may modify an incoming audio signal x[n] to produce an output audio signal y[n] with improved loudness characteristics. For example, loudness control system 200 may be part of the audio processing block 120 in the audio processing system 100 in FIG. 1.

With reference to FIG. 2, the loudness measurement module 205 may analyze a short segment of the input signal x[n] and may generate a short-term loudness estimate $L_{short}$[m]. The temporal smoothing module 210 may provide an estimate of the long-term average loudness level $L_{ave}$[m] by smoothing the short-term loudness estimates over time. The gain correction module 215 may apply a time-varying interpolated gain to the input signal x[n], where the gain may be controlled such that the long-term average loudness level of the output signal y[n] may be equal to a predetermined target loudness level.

The loudness measurement module 205 may use any process to estimate the perceived loudness of an audio signal. Examples of such processes include:

- The Loudness equivalent measures ($L_{eq}$), which may be coupled with A, B, or C frequency weightings as defined by the International Electrotechnical Commission (IEC);
- Zwicker and Fastl loudness model, which was the basis for a standard defined by the International Organization for Standardization (ISO); and
- The $L_{eq}$ measure coupled with a revised low-frequency B-weighting (RLB) frequency weighting and pre-filter as defined by the International Telecommunication Union (ITU).

For example, the ITU Recommendation (ITU-R) BS.1770 loudness measurement system may be used in the loudness measurement module 205 of a loudness control system 200. The ITU-R BS.1770 method is an international standard that has been widely adopted by the broadcast industry including the Advanced Television Systems Committee and European Broadcasting Union. The ITU-R BS.1770 implementation has generally low computational and memory requirements, and has been shown to correlate well with loudness perception by the listener.

The loudness measurement module 205 may estimate the perceived loudness of short segments of the input signal x[n], for example, segments of 5-10 milliseconds. The resulting short-term loudness estimates $L_{short}$[m] may be represented, for example, in the amplitude, energy, or decibel (dB) domains depending on the loudness control design and implementation.

A goal of a loudness control system 200 may be to generate an output signal y[n] with a uniform average loudness level, without overly compressing short-term signal dynamics. Accordingly, the temporal smoothing module 210 may average or smooth the short-term loudness estimates over time in order to obtain an estimate of the long-term average loudness level of a signal. A method for performing temporal smoothing on the short-term loudness estimates may be to apply a single-pole exponential moving average (EMA) filter, for example, according to the following equation:

$$L_{ave}[m] = L_{ave}[m-1]\cdot(1-\alpha) + L_{short}[m]\cdot\alpha \quad \text{Equation 1}$$

where $L_{short}$[m] is the short-term loudness estimate, $L_{ave}$[m] is the long-term average loudness estimate, and $\alpha$ is a smoothing factor that controls the behavior of the temporal smoothing.

The temporal smoothing module 210 may be designed with separate "attack" and "release" behaviors using different smoothing factor $\alpha$ values. The attack phase may refer to newly acquired short-term loudness estimates $L_{short}$[m] that are louder than previous average loudness estimates $L_{ave}$[m]. The release phase may refer to newly acquired short-term loudness estimates $L_{short}$[m] that are quieter than previous average loudness estimates $L_{ave}$[m]. Accordingly:

$$\alpha = \begin{cases} \alpha_{attack}, & L_{short}[m] > L_{ave}[m-1] \\ \alpha_{release}, & L_{short}[m] \le L_{ave}[m-1] \end{cases} \quad \text{Equation 2}$$

The attack and release smoothing factors $\alpha_{attack}$ and $\alpha_{release}$ may be set such that a long-term estimate of the average loudness level is approximated, where the attack smoothing factor $\alpha_{attack}$ may be set to a faster speed than the release smoothing factor $\alpha_{release}$ to approximate the asymmetric loudness integration of the human auditory system.

The tuning of the attack and release smoothing factors may be application specific and may have implications on the consistency of the output loudness levels. With relatively slow attack and release smoothing factors the average loudness estimate may track the signal loudness levels too slowly, resulting in output loudness levels that may fluctuate considerably. With relatively fast attack and release smoothing factors the average loudness estimate may track the short-term signal dynamics too closely, resulting in an output signal y[n] with consistent loudness levels but overly compressed signal dynamics.

A loudness control system 200 may include a static noise threshold $T_{noise,static}$ where input signals below this threshold are assumed to be unwanted noise and input signals above this threshold are assumed to be desired content. Loudness control systems may be designed to avoid reacting to assumed noise levels, such that objectionable amplification of noise may be reduced. Thus, short-term loudness estimates that measure below the noise threshold $T_{noise,static}$ may not be included in the long-term average loudness estimate, effectively "freezing" the average loudness estimate at its previous value.

One method to freeze the average loudness estimate when the short-term loudness estimate $L_{short}$[m] is below the static noise threshold $T_{noise,static}$ may be to add a condition to the temporal smoothing filter, whereby the average loudness estimate may effectively be maintained at its previous value by setting $\alpha$ to zero:

$$\alpha = \begin{cases} \alpha_{attack}, & L_{short}[m] > L_{ave}[m-1] \\ \alpha_{release}, & T_{noise,static} < L_{short}[m] \le L_{ave}[m-1] \\ 0, & L_{short}[m] \le T_{noise,static} \end{cases} \quad \text{Equation 3}$$

This is just one of many methods that can be employed to avoid reactions to low-level signals that are assumed to be noise.

The gain correction module 215 may calculate a time-varying gain value $G_{dB}$[m] by taking the difference between a predetermined target loudness level $Tar_{dB}$ and the average loudness estimate $L_{ave,dB}$[m], where the subscript dB specifies that loudness values are represented in the decibel domain:

$$G_{dB}[m] = Tar_{dB} - L_{ave,dB}[m] \quad \text{Equation 4}$$

The down-sampled gain values $G_{dB}[m]$ with sample rate $Fs_m$ may be converted to the linear domain and interpolated to create a smooth gain signal $G[n]$ with sample rate $Fs_n$. Interpolation methods may include, but are not limited to, EMA smoothing, linear interpolation, or cubic interpolation, for example. The output signal $y[n]$ is generated by multiplying the gain values $G[n]$ by the input signal $x[n]$:

$$y[n] = G[n] \cdot x[n] \quad \text{Equation 5}$$

Loudness control systems may relatively amplify unwanted noise, thereby reducing the signal-to-noise ratio (SNR) under certain scenarios such as speech with a moderate level of background noise. As discussed with reference to FIG. 2, loudness control system 200 may include a static noise threshold $T_{noise,static}$ as a simple method to limit the amplification of assumed noise. When the input signal loudness is measured below the noise threshold $T_{noise,static}$, the estimated average loudness level $L_{ave}[m]$, and hence the gain signal $G[n]$, freezes. This freezing mechanism may do an acceptable job of preserving SNR as long as the actual noise levels within the signal $x[n]$ are below the static noise threshold $T_{noise,static}$. However, when noise levels are above the noise threshold $T_{noise,static}$, the unwanted noise may be amplified. Real-world noise can be quite loud and unpredictable, requiring a more sophisticated solution than simple comparisons with a static threshold.

Improvements may be made to loudness control systems through advanced methods of detecting noise and noise levels. Knowledge of whether a segment of audio consists of desired content or unwanted noise may be useful information for a loudness control system. Automatic methods of noise detection may be used to classify whether a segment of audio is content or noise, as described below.

Types of unwanted noise may include, but are not limited to, background noise, ambient noise, environment noise, and hiss, for example. The characteristics of unwanted noise may be defined in order to detect the noise automatically. Unwanted noise may be defined as having the following characteristics:

Stationary: The signal power and spectral shape of the noise is assumed to be reasonably stationary over time.

Low Level: The noise is assumed to be reasonably low in level relative to the desired content.

Broad/Smooth Spectrum: The spectrum of the noise is assumed to be reasonably broad and smooth across frequency. Signals with significant spectral peaks or valleys (e.g. tonal signals) may be considered desired content.

A noise detection system or method may make use of one or more of the above assumptions.

Noise detection is not a trivial task, and may require sophisticated analysis for optimal performance. In an embodiment, a frequency domain noise detection system provides accurate classification results by exploiting the assumptions of stationarity and broadness of spectrum. However, loudness control systems are needed in many computational and power constrained applications. For these applications, according to another embodiment, a more efficient time domain noise detection system exploits the assumption of stationarity.

The solutions for noise detection described herein may generate a "soft" content-versus-noise classification. The classification may be defined, for example, over the range [0, 1] where zero indicates noise, one indicates content, and values in between are less confident classifications. The soft decision provides flexibility to systems that integrate noise detection.

Additionally, the noise detection systems described herein may be level independent. In other words, a scalar offset applied to the input signal may not change the classification. This is an important property because the expected levels of content and noise may vary considerably between applications, and making strong assumptions about signal levels may lead to compromised performance in some applications. Even though the noise detection systems are level independent, some cautious level dependent biases may be included to safely improve performance. By way of example, very loud signals (for example −12 to 0 decibels relative to full scale (dBFS)), may be interpreted as content with 100% confidence. Similarly, signals below a reasonable static noise threshold (for example −60 dBFS), may be considered noise with 100% confidence.

According to an embodiment, frequency domain noise detection may classify a signal as content or noise by estimating a noise spectrum and calculating a signal-to-noise ratio (SNR). High SNRs may indicate that the signal consists primarily of desired content and low SNRs may indicate that the signal consists primarily of noise. The noise spectrum may be estimated by attempting to remove any temporal dynamics or tonal components from the original spectrum that are assumed to be components of desired content. Spectral flux may be used to estimate temporal dynamics and a peakiness measure may be used to estimate tonal components.

Figure 3:
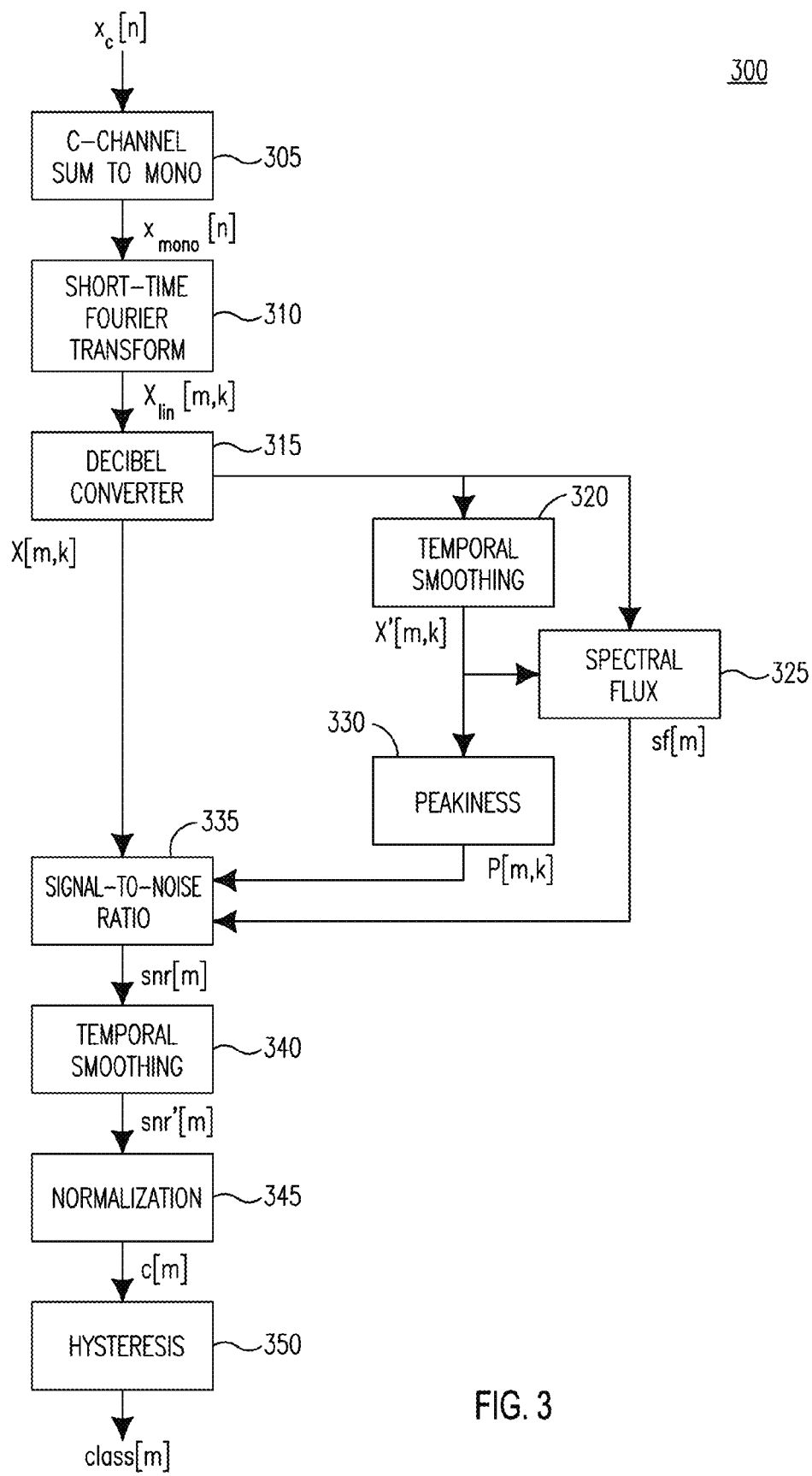
FIG. 3 shows a block diagram of a frequency domain noise detection system, in accordance with an embodiment.

A block diagram of a frequency domain noise detection system 300 is shown in FIG. 3, in accordance with an embodiment. The frequency domain noise detection system 300 may receive an audio signal $x_c[n]$, and may output a classification estimate class[m], indexed by m, such that the classification class[m] indicates if the signal is more likely to be content or noise. The classification may be defined, for example, over the range [0, 1] where zero indicates noise, one indicates content, and values in between are less confident classifications. However, other classification ranges may be used, for example, [−1, 1] or [0, 100].

The frequency domain noise detection system 300 may include any of the following: a channel summing component 305, a short-time Fourier transform (STFT) component 310, a decibel converter 315, a temporal smoothing component 320, a spectral flux measurement component 325, a peakiness measurement component 330, a signal-to-noise (SNR) estimator component 335, a temporal smoothing component 340, a normalization component 345, and a hysteresis component 350. The frequency domain noise detection system 300 is described in further detail below.

The channel summing component 305 may sum all channels of a C-channel signal $x_c[n]$ (except, possibly, the low frequency effects (LFE) channel, if included) to produce the following mono signal:

$$x_{mono}[n] = \sum_{c=0}^{C-1} x_c[n] \quad \text{Equation 6}$$

where n is the sample time index, c is the channel index, and C is the channel count, possibly excluding the LFE channel. The channel summing component 305 may improve computational efficiency and reduce resource requirements.

The mono signal $x_{mono}[n]$ may be divided into overlapping windowed frames before applying a STFT component 310:

$$X_{lin}[m,k] = \sum_{f=0}^{F-1} x_{mono}[f + mM]w[f]e^{-j\left(\frac{2\pi}{F}\right)kf} \quad \text{Equation 7}$$

where M is the sample hop size, F is the sample window size, m is the down-sampled time index, k is the frequency index from 0≤k≤K−1, K=(0.5·F+1) is the number of unique frequency indices, and w is the analysis window for example a Hann window of length F. In place of a STFT component 310, any other type of filter bank component may be used.

Decibel converter 315 may calculate a power spectrum from the STFT component 310 output $X_{lin}[m,k]$ and convert the power spectrum to the dB domain for each index m and k:

$$X[m,k]=10 \cdot \log_{10}(|X_{lin}[m,k]|^2) \quad \text{Equation 8}$$

Alternatively, the uniformly spaced power spectrum of the STFT component 310 may be combined into sub-bands approximating equivalent rectangular bandwidths (ERB), critical bandwidths, or some other perceptual bandwidths to reduce computation and storage requirements.

A temporal smoothing component 320 may estimate temporal averages X'[m,k] of the energy of each frequency band using, for example, exponential moving averages of the dB spectrum X[m,k] over time:

$$X'[m,k]=X'[m-1,k] \cdot (1-\alpha_s)+X[m,k] \cdot \alpha_s \quad \text{Equation 9}$$

where $\alpha_s$ is a smoothing factor that may be unique to this equation and may be chosen to produce desirable smoothing characteristics.

A spectral flux measurement component 325 may serve to measure spectral flux sf[m], which is a measure of spectral change over time. Noise signals tend to have stationary spectra measuring near zero flux, while content signals tend to have more dynamic spectra with onsets, offsets, and transients giving short durations of high flux. The spectral flux value may be calculated as the mean difference between the short-term spectrum X[m,k] and the time-smoothed spectrum X'[m,k]. The time-smoothed spectrum may be delayed by one frame to prevent integration of the current frame spectrum when calculating the spectral flux:

$$sf[m] = \frac{1}{K}\sum_{k=0}^{K-1}(X[m,k]-X'[m-1,k]) \quad \text{Equation 10}$$

Because spectral flux sf[m] is calculated in the dB domain, the measurement may be level independent and no further normalization may be required unlike flux calculations performed in the linear domain.

Peakiness P[m,k] estimates the tonal characteristic of a frequency band by measuring the relative energy of a frequency band compared to its neighbors. Peakiness may be estimated over a limited range of frequency bands that for typical content may contain tonal components, such as, for example, within the 20 Hz to 6 kHz range. A peakiness measurement component 330 may calculate peakiness by first estimating the average energy $P_{SE}[m,k]$ surrounding each frequency band k:

$$P_{SE}[m,k] = \frac{1}{2W}\left(-X'[m,k] + \sum_{r=max(k-W,0)}^{min(k+W,K-1)} X'[m,r]\right) \quad \text{Equation 11}$$

where 2W is the number of neighboring frequency bands to average.

The average energy of neighboring frequency bands $P_{SE}[m,k]$ may be subtracted from the center frequency band energy X'[m,k]:

$$P_{delta}[m,k]=X'[m,k]-P_{SE}[m,k] \quad \text{Equation 12}$$

Large positive values of $P_{delta}[m,k]$ may indicate the presence of a tonal component within the center frequency band k, while negative values of $P_{delta}[m,k]$ may indicate the presence of a tonal component within a neighboring frequency band. For noise detection applications where tonal components are of interest, the negative values may be set to zero and positive values may be spread into neighboring frequency bands to compensate for frequency band leakage when calculating peakiness:

$$P[m,k] = \sum_{r=max(k-W,0)}^{min(k+W,K-1)} \max(P_{delta}[m,r],0) \quad \text{Equation 13}$$

The SNR estimator component 335 may estimate a noise power spectrum N[m,k] by subtracting the peakiness P[m,k] and spectral flux sf[m] measures from the input power spectrum X[m,k]:

$$N[m,k]=X[m,k]-P[m,k]-|sf[m]| \quad \text{Equation 14}$$

The noise spectrum may be averaged across frequency to calculate a wide-band estimate of the noise level $n_{wide}[m]$:

$$n_{wide}[m] = \frac{1}{K}\sum_{k=0}^{K-1} N[m,k] \quad \text{Equation 15}$$

Furthermore, the input signal power spectrum may be averaged across frequency to calculate a wide-band estimate of the signal level $x_{wide}[m]$:

$$x_{wide}[m] = \frac{1}{K}\sum_{k=0}^{K-1} X[m,k] \quad \text{Equation 16}$$

The SNR estimator component 335 may calculate snr[m] by subtracting the estimated wide-band noise level $n_{wide}[m]$ from the estimated wide-band signal level $x_{wide}[m]$:

$$snr[m]=x_{wide}[m]-n_{wide}[m] \quad \text{Equation 17}$$

Because the resulting SNR, snr[m], may be highly variant, the temporal smoothing component 340 may apply an exponential moving average filter to snr[m] to reduce variance and capture the greater SNR trend to produce a smoothed SNR, snr'[m]:

$$snr'[m] = snr'[m-1] \cdot (1-\alpha) + snr[m] \cdot \alpha, \quad \text{Equation 18}$$
$$\text{where } \alpha = \begin{cases} \alpha_{attack,snr}, & snr[m] > snr'[m-1] \\ \alpha_{release,snr}, & snr[m] \leq snr'[m-1] \end{cases}$$

The smoothing factors $\alpha_{attack,snr}$ and $\alpha_{release,snr}$, which may be unique to the smoothing SNR calculation performed in temporal smoothing component 340, may be chosen to produce desirable smoothing characteristics.

The smoothed SNR value snr'[m] may be converted to an intermediate classification value c[m] by the normalization component 345. For example, the values may be normalized to the range [0, 1] via a dB-to-linear domain conversion and a scaling and translation such that zero indicates noise, one indicates content, and values in between are less confident classifications:

$$c[m] = 1 - 10^{\frac{-snr'[m]}{20}} \qquad \text{Equation 19}$$

The hysteresis component 350 may calculate the final classification result by applying a model of hysteresis. The hysteresis model biases the final classification based on past classifications. Two thresholds may be used: a higher content threshold $T_{content}$ and a lower noise threshold $T_{noise}$, where the thresholds may be unique to the scalar bias calculation, Equation 21. When the intermediate classification value c[m] exceeds the content threshold, $T_{content}$, the final classification, class[m], may be biased toward a content classification until the intermediate classification value c[m] falls below the lower noise threshold, $T_{noise}$, which may cause the final classification class[m] to be biased toward a noise classification until the content threshold is crossed again:

$$\text{class}[m] = \text{saturate}(c[m] \cdot \beta[m]), \qquad \text{Equation 20}$$
where $$\beta[m] = \begin{cases} \beta_{content}, & c[m] \geq T_{content} \\ \beta_{noise}, & c[m] \leq T_{noise} \\ \beta[m-1], & T_{noise} < c[m] < T_{content} \end{cases} \qquad \text{Equation 21}$$

and $$\text{saturate}(x) = \begin{cases} x, & 0 \leq x \leq 1 \\ 1, & x > 1 \\ 0, & x < 0 \end{cases} \qquad \text{Equation 22}$$

For Equations 20-22, class[m] is the final classification result, $\beta_{content}$ is a positive bias scalar that may be chosen to be, for example, greater than one, and $\beta_{noise}$ is a positive bias scalar that may be chosen to be, for example, less than one.

Figure 4:
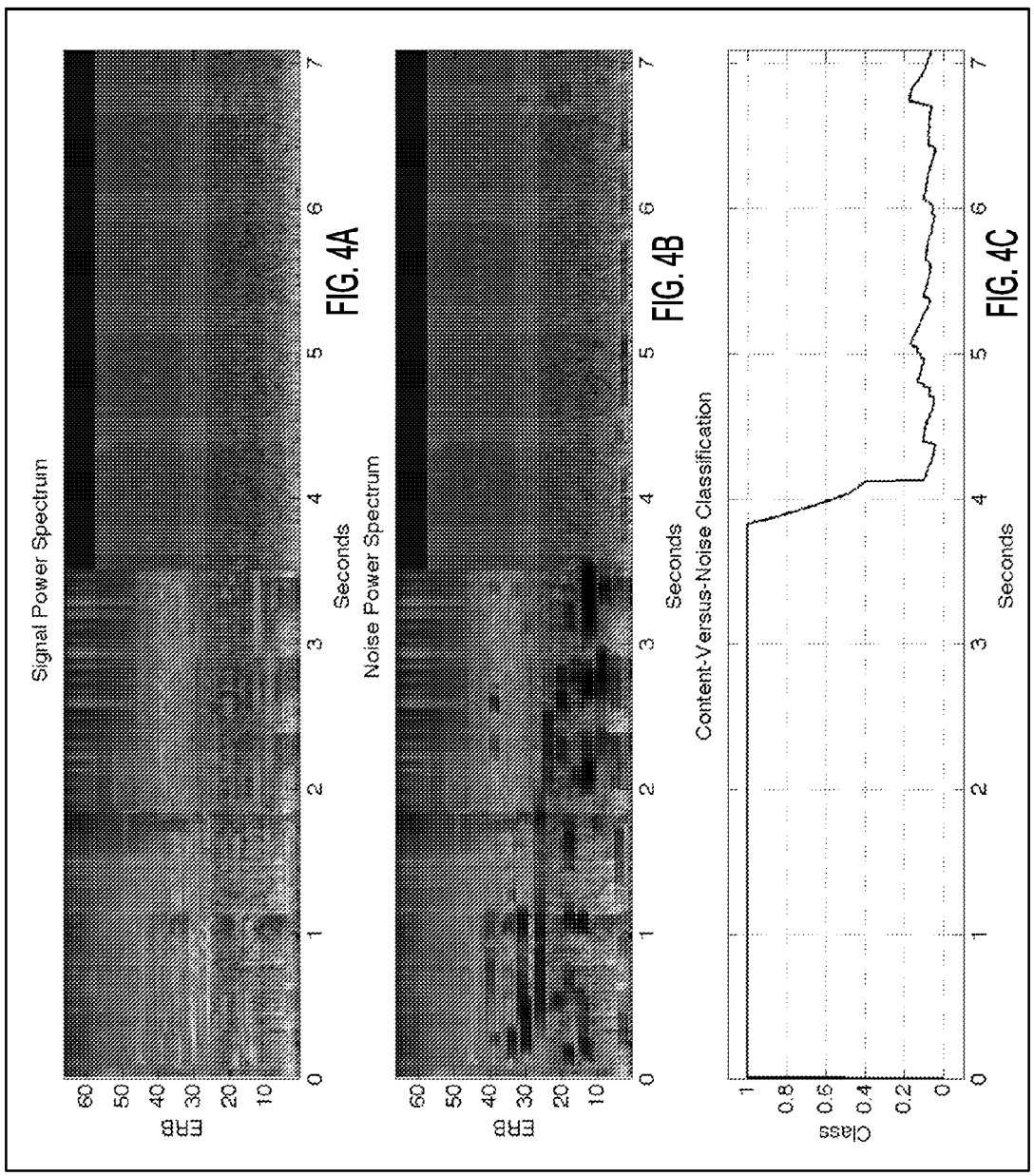
FIG. 4A shows the signal power spectrum for a segment of music followed by a segment of noise.
FIG. 4B shows an estimate of the noise power spectrum for a segment of music followed by a segment of noise, where the tonal and transient structure of the signal has been removed.
FIG. 4C shows the content-versus-noise classification output from a frequency domain noise detection system for the signal shown in FIG. 4A.

FIGS. 4A and 4B show the signal power spectrum X[m, k] and noise power spectrum N[m, k], respectively, for frequency bands that have been converted to equivalent rectangular bandwidths (ERBs), over a content-to-noise transition at approximately 3.5 seconds. The content-to-noise transition may be, for example, a transition from a segment of music to a segment of noise. The tonal and transient structure has been removed from the noise power spectrum shown in FIG. 4B, as may be done by spectral flux measurement 325 and peakiness measurement component 330 components described in FIG. 3. FIG. 4C shows the content-versus-noise classification output from a frequency domain noise detection system 300, as described in FIG. 3, for the signal shown in FIG. 4A. In this example scenario, a classification of zero indicates noise and one indicates content. In FIG. 4B, the segment of noise starting at 3.5 seconds has a noise power spectrum that is nearly identical to the input power spectrum due to a lack of tonal and transient structure in the noise segment. As illustrated in FIG. 4C, the frequency domain noise detection system 300 of FIG. 3 is able to detect the transition from content to noise in the signal within one second.

According to another embodiment, noise detection may be performed in the time domain. A time domain noise detection system or method may be used in scenarios where low computational requirements are desired. The time domain noise detection system may exploit the assumption that typical noise signals have signal power that is reasonably stationary over time, while typical content signals have signal power that exhibits time-varying dynamics.

Figure 5:
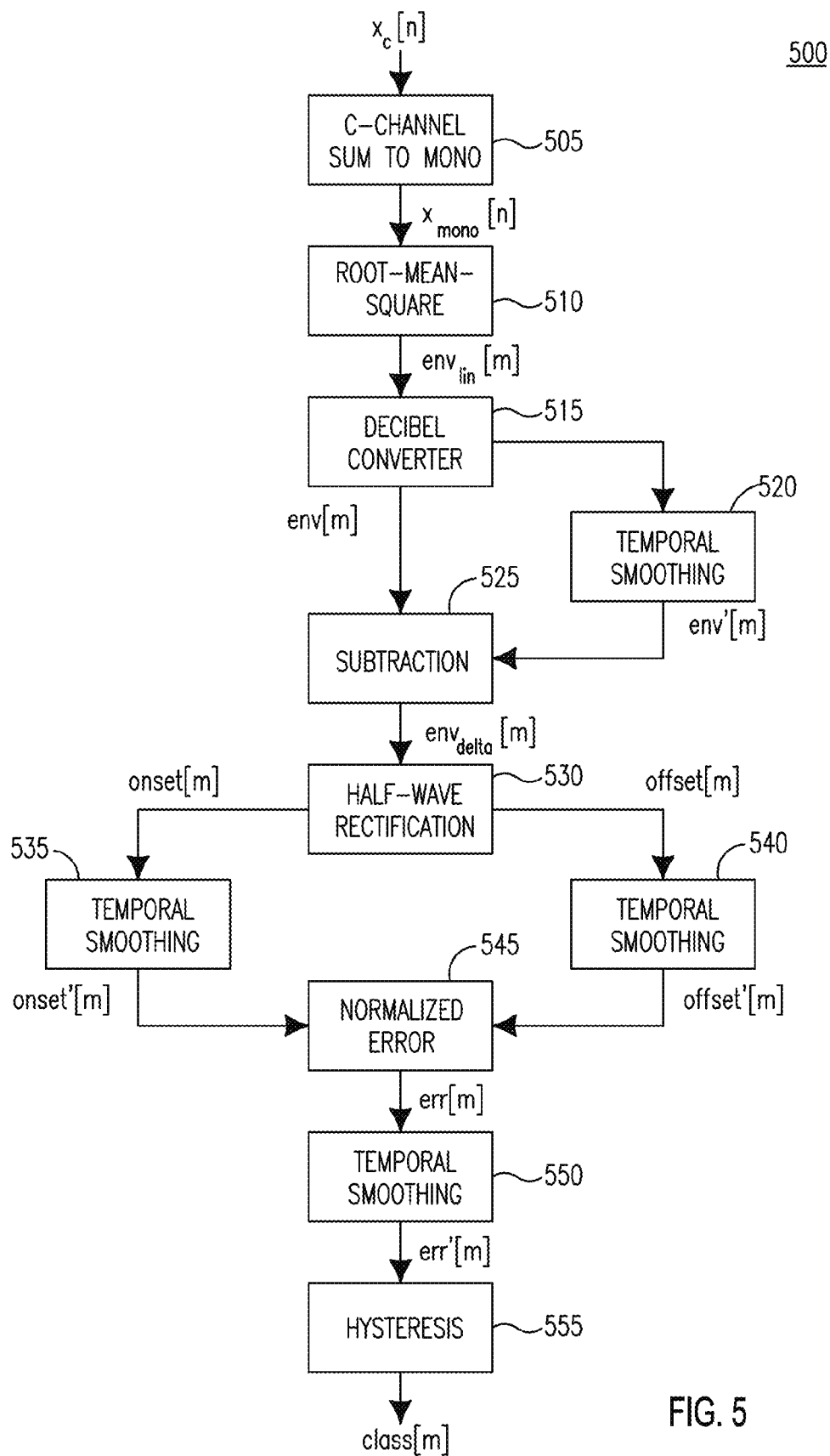
FIG. 5 shows a block diagram of a time domain noise detection system, in accordance with an embodiment.

A block diagram of a time domain noise detection system 500 is shown in FIG. 5, in accordance with an embodiment. The time domain noise detection system 500 may receive an audio signal $x_c[n]$, and may output a classification estimate class[m], indexed by m, such that the classification class[m] indicates if the signal is more likely to be content or noise. The classification may be defined, for example, over the range [0, 1] where zero indicates noise, one indicates content, and values in between are less confident classifications. However, other classification values may be used.

The time domain noise detection system 500 may include any of the following: a channel summing component 505, a root-mean-square (RMS) component 510, decibel converter 515, temporal smoothing filter 520, a subtraction component 525, a half-wave rectification component 530, temporal smoothing components 535 and 540, a normalized error calculator 545, a temporal smoothing component 550, and a hysteresis component 555. The time domain noise detection system 500 is described in further detail below.

The channel summing component 505 may sum all channels of a C-channel signal $x_c[n]$ (except, possibly, the low frequency effects (LFE) channel, if included) to produce the following mono signal:

$$x_{mono}[n] = \sum_{c=0}^{C-1} x_c[n] \qquad \text{Equation 23}$$

where n is the sample time index, c is the channel index, and C is the channel count, possibly excluding the LFE channel. The channel summing component 505 may improve computational efficiency and reduce resource requirements.

The root-mean-square (RMS) component 510 may convert the input signal to a linear domain short-term envelope estimate $env_{lin}[m]$ by computing the root-mean-square (RMS) over a window of F samples:

$$env_{lin}[m] = \frac{1}{F} \sum_{f=0}^{F-1} (x_{mono}^2[f + mM]) \qquad \text{Equation 24}$$

The linear domain short-term envelope estimate $env_{lin}[m]$ may be converted to a dB domain short-term envelope estimate env[m] via the decibel converter component 515:

$$env[m] = 10 \cdot \log_{10}(env_{lin}[m]) \qquad \text{Equation 25}$$

Note that any other envelope estimator or technique for estimating the short-term envelope of the input signal may be used. Signal envelopes can be useful for differentiating between content and noise. The short-term envelope of typical noise signals tends to exhibit symmetry around the long-term envelope mean, while the short-term envelope of typical content signals tends to be fairly irregular or asymmetrical.

A temporal smoothing component 520, for example a single-pole exponential moving average (EMA) smoothing filter, may be applied to the short-term envelope estimate env[m] to generate a long-term mean envelope estimate env'[m]:

$$\text{env}'[m]=\text{env}'[m-1]\cdot(1-\alpha_{env})+\text{env}[m]\cdot\alpha_{env} \qquad \text{Equation 26}$$

where the smoothing factor $\alpha_{env}$, which may be unique to the calculation of the long-term mean envelope estimate env'[m], may be chosen to produce desirable smoothing characteristics.

A subtraction component 525 may calculate an envelope delta value by subtracting the long-term mean envelope estimate from the short-term envelope value:

$$\text{env}_{delta}[m]=\text{env}[m]-\text{env}'[m] \qquad \text{Equation 27}$$

A half-wave rectification component 530 may apply positive half-wave rectification to the envelope delta value, where negative values may be set to zero, providing an estimate of the short-term onset energy in the signal:

$$\text{onset}[m]=\max(\text{env}_{delta}[m], 0) \qquad \text{Equation 28}$$

A temporal smoothing component 535 may be applied to the onset energy to estimate a long-term mean of the onset energy:

$$\text{onset}'[m]=\text{onset}'[m-1]\cdot(1-\alpha_{onset})+\text{onset}[m]\cdot\alpha_{onset} \qquad \text{Equation 29}$$

where the smoothing factor $\alpha_{onset}$, which may be unique to the calculation of Equation 29, may be chosen to produce desirable smoothing characteristics.

The half-wave rectification component 530 may also apply negative half-wave rectification to the envelope delta value, where positive values may be set to zero, and an absolute value may be taken providing an estimate of the short-term offset energy in the signal:

$$\text{offset}[m]=|\min(\text{env}_{delta}[m], 0)| \qquad \text{Equation 30}$$

A temporal smoothing component 540 may be applied to the offset energy to estimate a long-term mean of the offset energy:

$$\text{offset}'[m]=\text{offset}'[m-1]\cdot(1-\alpha_{offset})+\text{offset}\cdot\alpha_{offset} \qquad \text{Equation 31}$$

where the smoothing factor $\alpha_{offset}$, which may be unique to the calculation of Equation 31, may be chosen to produce desirable smoothing characteristics.

For typical noise signals, the onset and offset mean energies onset'[m] and offset'[m] may be similar in level, while for typical content signals the mean energies may have significant differences. A normalized error calculator 545 may calculate a squared error err[m] between the onset and offset mean energies and may normalize the error, for example, between zero and one by dividing by the maximum of the mean energies:

$$err[m] = \left(\frac{\text{onset}'[m] - \text{offset}'[m]}{\max(\text{onset}'[m], \text{offset}'[m])}\right)^2 \qquad \text{Equation 32}$$

For example, the irregular temporal structure of content signals may result in err[m] tending towards one, while a lack of temporal structure in stationary noise may result in err[m] tending towards zero.

Temporal smoothing component 550 may help generate a content-versus-noise classification by temporally smoothing the squared error err[m] to reduce variance:

$$err'[m]=err'[m-1]\cdot(1-\alpha_{err})+err[m]\cdot\alpha_{err} \qquad \text{Equation 33}$$

The smoothing factor $\alpha_{err}$ may be signal-dependent in order to create differing attack and release characteristics determined by attack smoothing factor $\alpha_{attack,err}$ and release smoothing factor $\alpha_{release,err}$:

$$\alpha_{err} = \begin{cases} \alpha_{attack,err}, & err[m] > \text{class}[m-1] \\ \alpha_{release,err}, & err[m] \leq \text{class}[m-1] \end{cases} \qquad \text{Equation 34}$$

The attack and release smoothing factors $\alpha_{attack,err}$ and $\alpha_{release,err}$ used within the time domain noise detection system 500 may be unique to Equation 34 and may be faster than, for example, those used by the temporal smoothing module 210 of loudness control system 200 in FIG. 2. This may enable the noise detection system to classify the signal as content or noise faster than the loudness control system corrects the level.

With reference to FIG. 5, the hysteresis component 555 may calculate the final content-versus-noise classification class[m] by applying a model of hysteresis to err'[m], in a similar manner to the hysteresis component 350 of the frequency domain noise detection system 300 in FIG. 3.

FIG. 6A illustrates an envelope env and a smoothed envelope env', in dB, of a signal consisting of a content-to-noise transition where the first half is a segment of music and the second half is a segment of noise. As illustrated in FIG. 6A, the first half of the envelope signal, from 0 to roughly 3.5 seconds, shows short-term envelope env irregularity relative to a long-term mean envelope env', and the second half, from 3.5 to 7 seconds, shows short-term envelope env symmetry relative to a long-term mean envelope env'. FIG. 6B shows an example content-versus-noise classification output from a time domain noise detection system 500 in FIG. 5 corresponding to the signal in FIG. 6A, where zero indicates noise and one indicates content.

Noise detection classification results class[m], as produced by, for example, the frequency domain noise detection system 300 of FIG. 3, or the time domain noise detection system 500 of FIG. 5, may be integrated into a loudness control system, such as the loudness control system 200 of FIG. 2.

Figure 7:
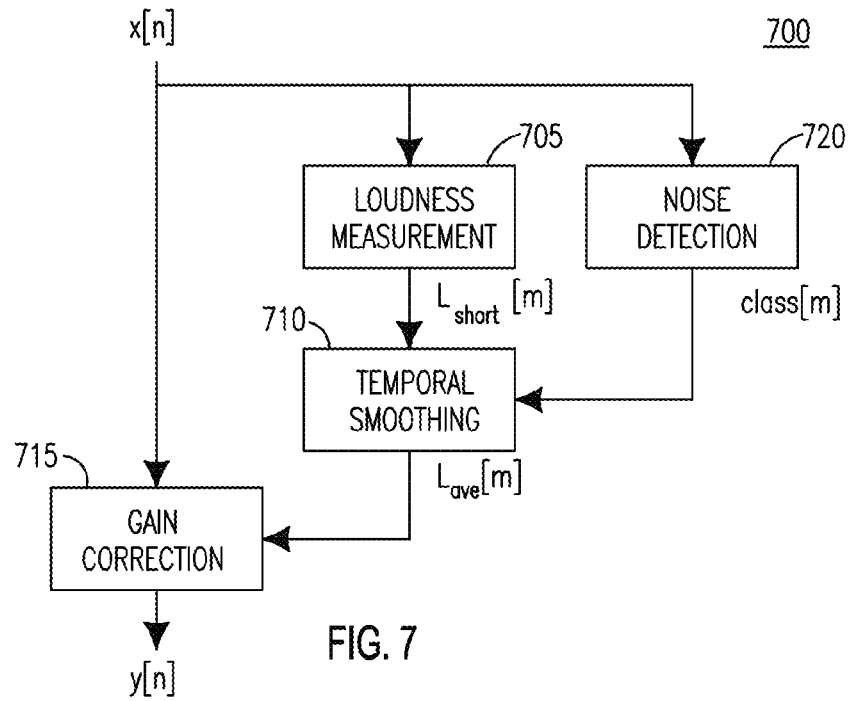
FIG. 7 shows a block diagram of a loudness control system with noise detection, in accordance with an embodiment.

For example, FIG. 7 illustrates a high-level block diagram of the integration of a noise detection module 720 into a loudness control system 700, in accordance with an embodiment. The loudness control system 700 may include a loudness measurement module 705, a noise detection module 720, a temporal smoothing module 710, and a gain correction module 715. The loudness measurement module 705 and the gain correction module 715 may operate similarly to the loudness measurement module 205 and the gain correction module 215 described in FIG. 2. The noise detection module may use any noise detection technique to produce a content-versus-noise classification result class [m], including the frequency domain and time domain approaches of FIGS. 3 and 5, respectively. The temporal smoothing module 710 may then take into account the final classification output class[m] from the noise detection module 720, as described below.

The temporal smoothing module 710 of a loudness control system 700 may be equipped with separate "attack" and "release" smoothing factors, similar to the temporal smoothing module 210 of a loudness control system 200 in FIG. 2. The release smoothing factor $\alpha_{release}$ may control the speed at which the loudness control is allowed to increase its gain level. Fast $\alpha_{release}$ values may allow the loudness control to quickly increase gain levels, while slow a $\alpha_{release}$ values may constrain the speed at which gain levels are allowed to increase. At an extreme, the release smoothing factor may be set to zero to freeze the loudness control, effectively allowing no increase in gain level to occur.

With a lack of knowledge of whether a signal consists of content or noise, the loudness control system 200 of FIG. 2 may be forced to increase gain levels for desired content and unwanted noise at the same speed. However, the loudness control system 700 of FIG. 7, with knowledge of whether a signal consists of content or noise, can make improved decisions to increase gain levels at fast speeds for desired content while increasing gain levels at significantly slower speeds, if at all, for unwanted noise.

In an embodiment, noise dependent gain levels may be implemented by dynamically modifying the release smoothing factor value $\alpha_{release}$ in the temporal smoothing module 710 based on the content-versus-noise classification class[m] received from the noise detection module 720.

When the noise detection module 720 detects a signal as desired content with high confidence, the $\alpha_{release}$[m] value may be set to a predetermined value $\alpha_{release,def}$ corresponding to a default speed for increases in gain level. When a signal is detected as unwanted noise with high confidence, the $\alpha_{release}$[m] value may be set to zero, effectively allowing no increase in gain level to occur. Additionally, if a "soft" classification of the noise detection is used, then less confident noise detections may slow the increase in gain levels proportional to the noise detection confidence. For example, using a soft classification over the range [0, 1], a noise classification result of class[m]=0.5 may indicate that there is 50% confidence that the signal is content and 50% confidence that the signal is noise. In this case, the $\alpha_{release}$[m] value may be set to an interpolated value between the default value and zero, thus constraining the speed at which the gain levels are allowed to increase by an intermediate amount:

$$\alpha_{release}[m] = \alpha_{release,def} \cdot class[m] \qquad \text{Equation 35}$$

Allowing no increase in gain levels for unwanted noise may have the effect of preserving the SNR of the input signal x[n]. For example, during a content-to-noise transition, where the noise level is lower than the content level, the loudness control system 700 may apply an equal gain level to both the content and noise segments since the gain level is prevented from increasing for noise signals. Thus, the relative content and noise levels that exist in the input signal will be preserved in the output signal.

Preservation of SNR is not the only enhancement that can be achieved with content-versus-noise classifications. Other enhancements such as noise suppression can also be realized within the context of a loudness control by applying relative attenuation when noise signals are detected.

According to another embodiment, a loudness drop detection system or method may be used to dynamically modify gain correction speeds in a loudness control system, such as the loudness control system 200 of FIG. 2.

A design goal of a loudness control system 200 may be to normalize long-term loudness levels while preserving original signal dynamics. However, controlling large loudness drops due to inter-content transitions without adversely limiting intra-content dynamics may be challenging. In order to recover quickly after large long-term loudness drops, the release smoothing factor $\alpha_{release}$ of temporal smoothing module 210 may be calculated using a sufficiently fast time constant. However, in order to preserve short-term signal dynamics, the release smoothing factor $\alpha_{release}$ may be calculated using a sufficiently slow time constant. To address these opposing goals, a loudness drop detection module may be included in a loudness control system 200 to modify the release smoothing factor $\alpha_{release}$ in a dynamic and signal-dependent manner.

Figure 8:
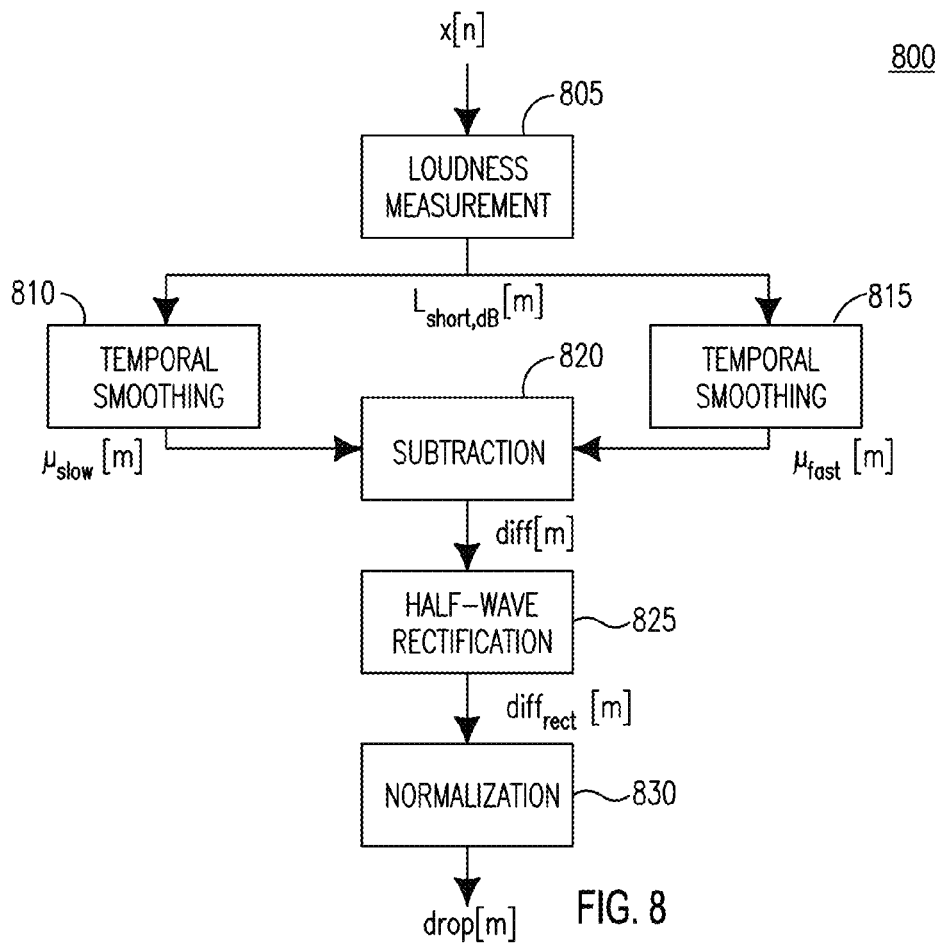
FIG. 8 shows a block diagram of a loudness drop detection system, in accordance with an embodiment.

According to an embodiment, a loudness drop detection system may robustly detect large long-term loudness drops while avoiding detection during loudness fluctuations due to short-term signal dynamics. FIG. 8 shows a block diagram of a loudness drop detection system 800, in accordance with an embodiment. The loudness drop detection system 800 in FIG. 8 may receive an audio signal x[n], and may output a time-varying loudness drop detection estimate drop[m], indexed by m, such that drop[m] indicates whether or not a significant loudness level drop has occurred. The loudness drop detection estimate drop[m] may be defined, for example, over the range [0, 1] where zero indicates an absence of loudness drops, one indicates that a large loudness drop has just occurred, and values in between are indicators of smaller or more moderate loudness drops. However, other drop detection values may be used.

The loudness drop detection system 800 may include any of the following: a short-term loudness measurement module 805, temporal smoothing components 810 and 815, a subtraction module 820, a half-wave rectification module 825, and a normalization module 830.

A short-term loudness measurement module 805 may calculate a short-term loudness estimate, similar to the loudness measurement module 205 of loudness control system 200 in FIG. 2. The short-term loudness measurement module 805 may use any loudness measurement technique including, for example, ITU-R BS.1770 loudness measure, or, RMS, both as previously described herein. The short-term loudness estimate calculated on the current down-sampled index m may be denoted $L_{short,dB}[m]$.

Temporal smoothing components 810 and 815 may apply temporal smoothing to the short-term loudness estimate $L_{short,dB}[m]$. Temporal smoothing components 810 and 815 may be, for example, two exponential moving average (EMA) filters with differing smoothing factors. The temporal smoothing components 810 and 815 each may calculate a smoothed loudness estimate $\mu_{slow}[m]$ and $\mu_{fast}[m]$, respectively, using a relatively slow smoothing factor $\alpha_{slow}$ and a relatively fast smoothing factor $\alpha_{fast}$, respectively:

$$\mu_{slow}[m] = \mu_{slow}[m-1] \cdot (1-\alpha_{slow}) + L_{short,dB}[m] \cdot \alpha_{slow} \qquad \text{Equation 36}$$

$$\mu_{fast}[m] = \mu_{fast}[m-1] \cdot (1-\alpha_{fast}) + L_{short,dB}[m] \cdot \alpha_{fast} \qquad \text{Equation 37}$$

The smoothed loudness estimates $\mu_{slow}[m]$ and $\mu_{fast}[m]$ may track loudness dynamics at different speeds. The goal of $\mu_{slow}[m]$ may be to follow the long-term mean of the loudness estimates without tracking the short-term dynamics, for example, like pauses between spoken words. The goal of $\mu_{fast}[m]$ may be to track the mean of the loudness estimates more quickly, allowing a loudness drop to be inferred when $\mu_{fast}[m]$ is sufficiently lower in level than $\mu_{slow}[m]$. The subtraction module 820 may calculate the difference diff[m] between the smoothed loudness estimates $\mu_{slow}[m]$ and $\mu_{fast}[m]$ to capture the loudness change in the input signal:

$$\text{diff}[m] = \mu_{slow}[m] - \mu_{fast}[m] \qquad \text{Equation 38}$$

For example, positive diff[m] values may indicate loudness drops, while negative values may indicate loudness increases. The half-wave rectification module 825 may apply positive half-wave rectification to the difference signal diff[m], creating a signal $\text{diff}_{rect}[m]$ that indicates loudness drops while being unaffected by loudness increases in the signal:

$$(\text{diff})_{rect}[m] = \begin{cases} \text{diff}[m], & \text{diff}[m] > 0 \\ 0.0, & \text{diff}[m] \le 0 \end{cases} \quad \text{Equation 39}$$

The normalization module 830 may normalize the rectified difference $\text{diff}_{rect}[m]$ to convert from the dB range to any desired detection range to produce a drop detection value drop[m]. By way of example, for the detection range [0,1], a simple translation, scaling, and saturation may be used for normalization as follows:

$$\text{drop}[m] = \text{saturate}\left(\frac{\text{diff}_{rect}[m] - D_{min}}{D_{max} - D_{min}}\right), \quad \text{Equation 40}$$

$D_{max} > D_{min} \ge 0$ where $$\text{saturate}(x) = \begin{cases} x, & 0 \le x \le 1 \\ 1, & x > 1 \\ 0, & x < 0 \end{cases} \quad \text{Equation 41}$$

and where $D_{min}$ and $D_{max}$ denote loudness drop threshold values that map to detection values of, for example, zero and one, respectively. In this example, loudness drop detection values drop[m] of one indicate that a loudness drop greater than $D_{max}$ has occurred, which may occur during inter-content transitions such as, for example, a loud television commercial that transitions into a quiet program. Values of zero indicate an absence of drops, which are common, for example, throughout a single piece of content. Values between zero and one indicate loudness drops at intermediate levels.

Figure 9:
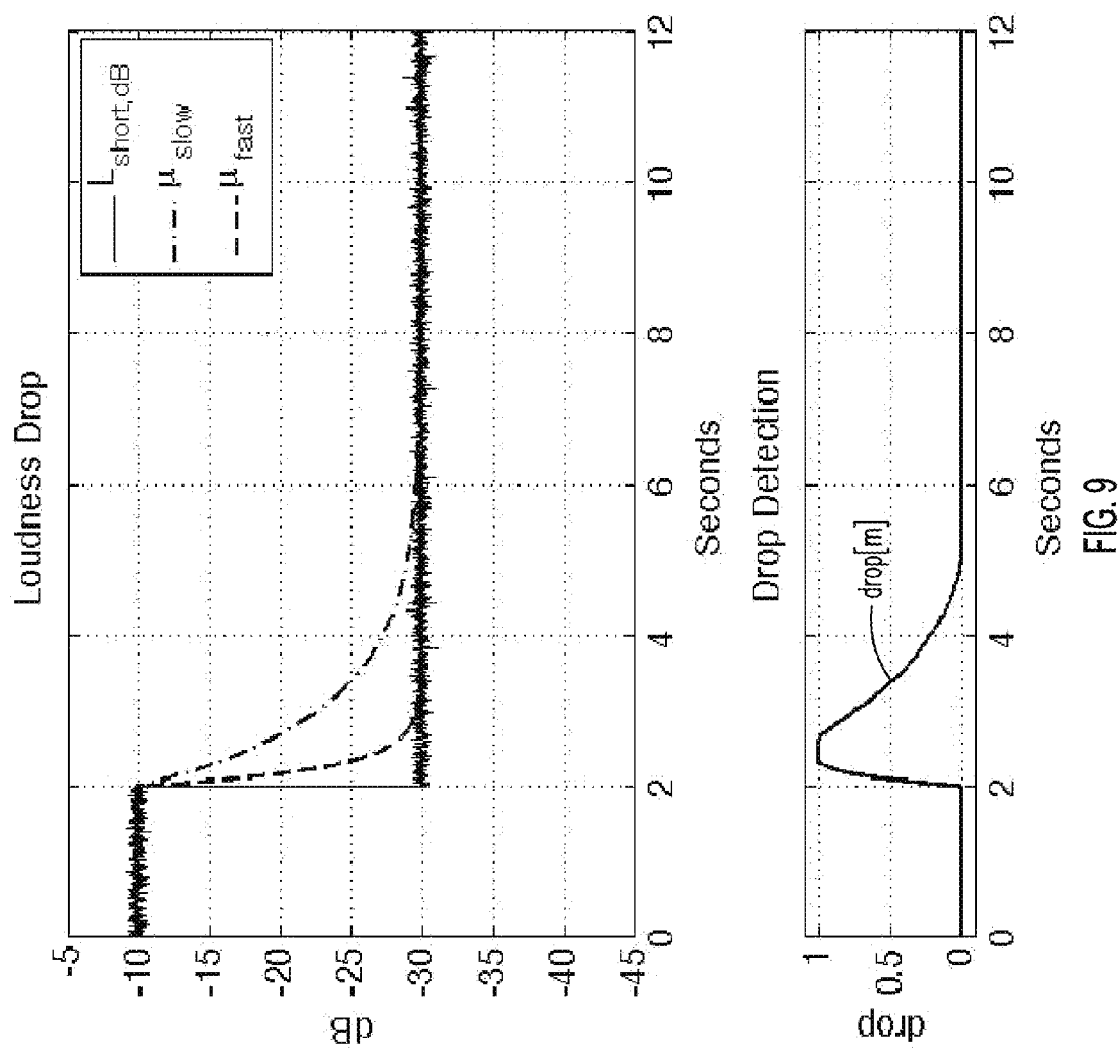
FIG. 9 shows example signals in dB for a short-term loudness estimate, two smoothed filter outputs, and a resulting loudness drop detection signal within a loudness drop detection system.

FIG. 9 shows the short-term loudness estimate $L_{short,dB}$[M] (solid), the two smoothed filter outputs $\mu_{slow}$[m] (dash-dot) and $\mu_{fast}$[m] (dash), and the loudness drop detection signal drop[m] (lower plot), for a loudness drop detection system 800 of FIG. 8, applied to an audio signal consisting of a large loudness drop at two seconds. Note that the short-term loudness estimate $L_{short,dB}$[m] (solid) drops nearly instantaneously at two seconds from approximately −10 dB to −30 dB and the temporally smoothed filter output $\mu_{fast}$[m] (dash) reaches −30 dB more quickly than the temporally smoothed filter output $\mu_{fast}$[m] (dash-dot). The loudness drop detection signal drop[m] in the lower plot indicates a loudness drop beginning at two seconds, and peaking at approximately 2.5 seconds indicating that a large loudness drop has occurred. The smoothing factors $\alpha_{slow}$ and $\alpha_{fast}$ were mutually chosen to be relatively fast which directly controls the speed at which a loudness drop detection can occur.

The example of FIG. 9 illustrates the ability of the loudness drop detection system, for example the system 800 of FIG. 8, to identify large drops in loudness quickly via relatively fast values for both $\alpha_{slow}$ and $\alpha_{fast}$. However, at these same mutually fast smoothing factors, detection performance may be sub-optimal for highly dynamic signals such as dialog and may generate frequent false detections where natural signal fluctuations are falsely detected as loudness drops.

Figure 10B:
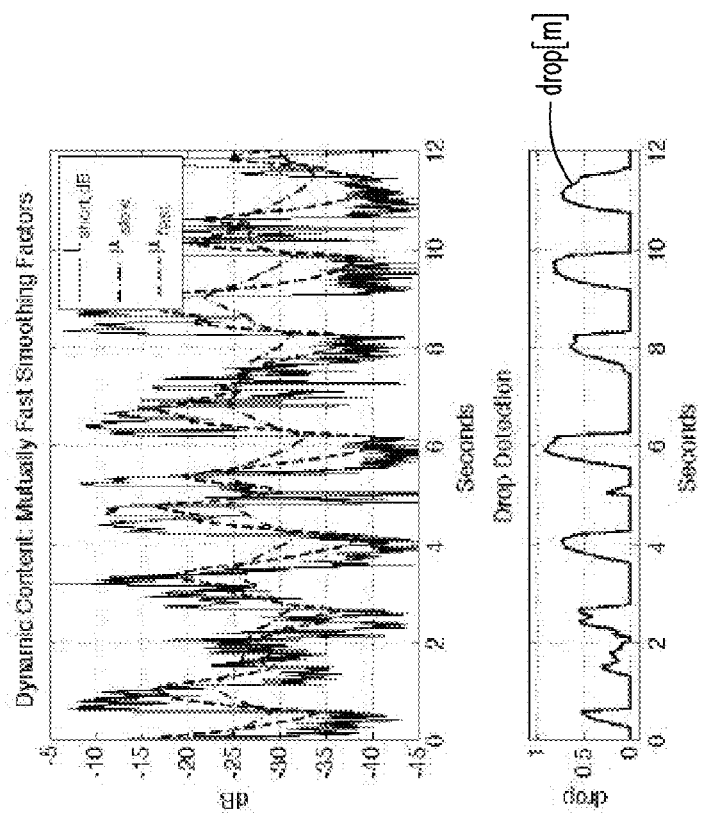
FIGS. 10A-10D each show examples of the short-term loudness estimate, the smoothed filter outputs, and the loudness drop detection signal, for different smoothing factor choices in a loudness drop detection system.
Figure 10A:
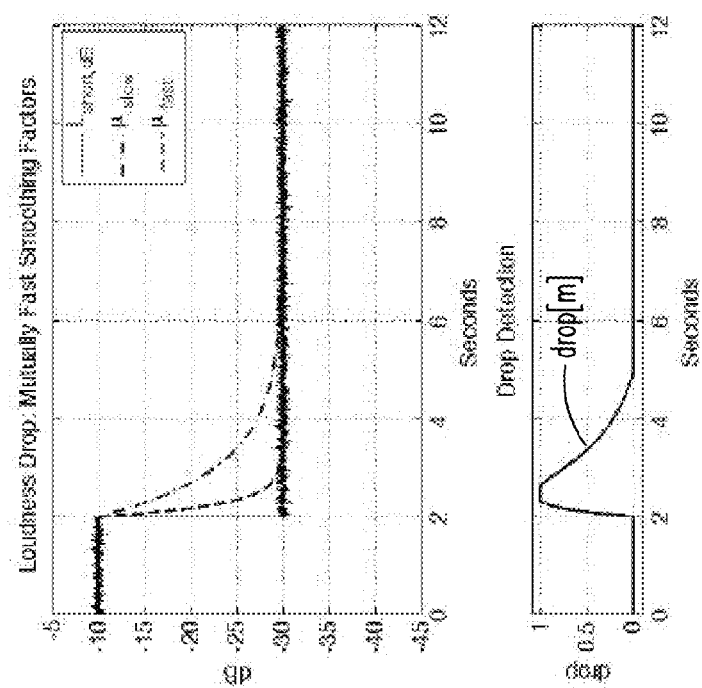

Similar to FIG. 9, FIGS. 10A-10D each show examples of the short-term loudness estimate $L_{short,dB}$[m] (solid), the two smoothed filter outputs $\mu_{slow}$ [m] (dash-dot) and $\mu_{fast}$[m] (dash), and the loudness drop detection signal drop[m] (lower plot), for different smoothing factor choices for $\alpha_{slow}$ and $\alpha_{fast}$ in a loudness drop detection system, such as the loudness drop detection system 800 of FIG. 8. The audio signal from FIG. 9 consisting of a loudness drop at two seconds is used again in FIGS. 10A and 10C, where FIG. 10A shows results using mutually fast smoothing factors $\alpha_{slow}$ and $\alpha_{fast}$, and 10C shows results using mutually slow smoothing factors $\alpha_{slow}$ and $\alpha_{fast}$. For the audio signal shown in FIGS. 10A and 10C, it may be desirable for a loudness drop detection system to detect the loudness drop as quickly as possible. A segment of dynamic speech is used in FIGS. 10B and 10D, where FIG. 10B shows results using mutually fast smoothing factors $\alpha_{slow}$ and $\alpha_{fast}$, and 10D shows results using mutually slow smoothing factors $\alpha_{slow}$ and $\alpha_{fast}$. Note the large fluctuations in short-term loudness level $L_{short,dB}$[m] in the dynamic speech signal as the content consists of a series of loud spoken words at approximately −10 dB separated by quieter ambient environment noise at approximately −40 dB. Because the dynamic speech signal does not contain any long-term loudness drops, an ideal loudness drop detection system would not detect any loudness drops.

The drop detection signal drop[m] in FIG. 10A shows that for a signal containing a large long-term loudness drop, the mutually fast smoothing factors enable the loudness drop detection system 800 of FIG. 8 to detect the loudness drop quickly and accurately at approximately 2.5 seconds. However, the drop detection signal drop[m] in FIG. 10B shows that for a highly dynamic signal, the mutually fast smoothing factors cause the loudness drop detection system to inaccurately report many partial detections due to $\mu_{fast}$[m] reacting too quickly and tracking pauses between words in the speech.

Figure 10D:
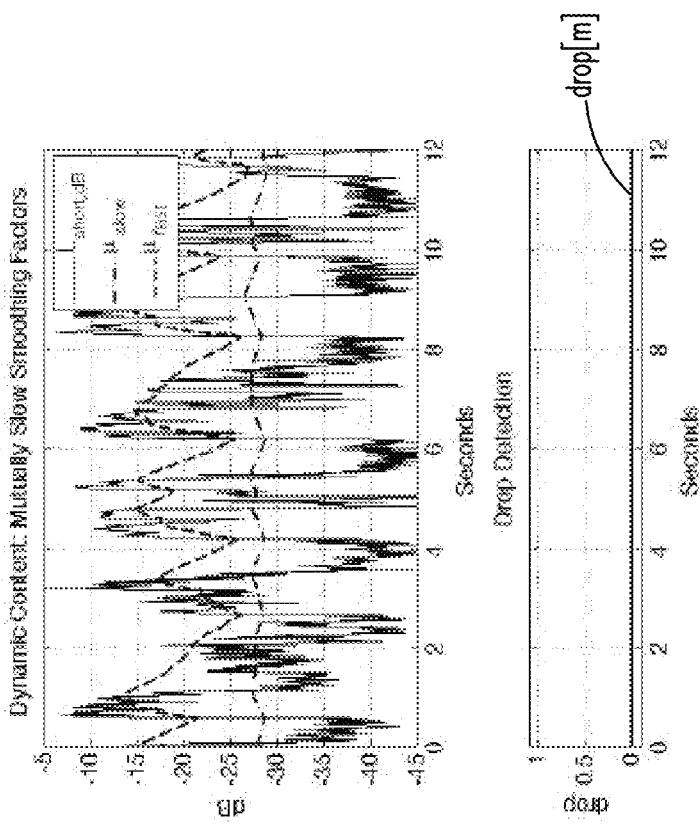
Figure 10C:
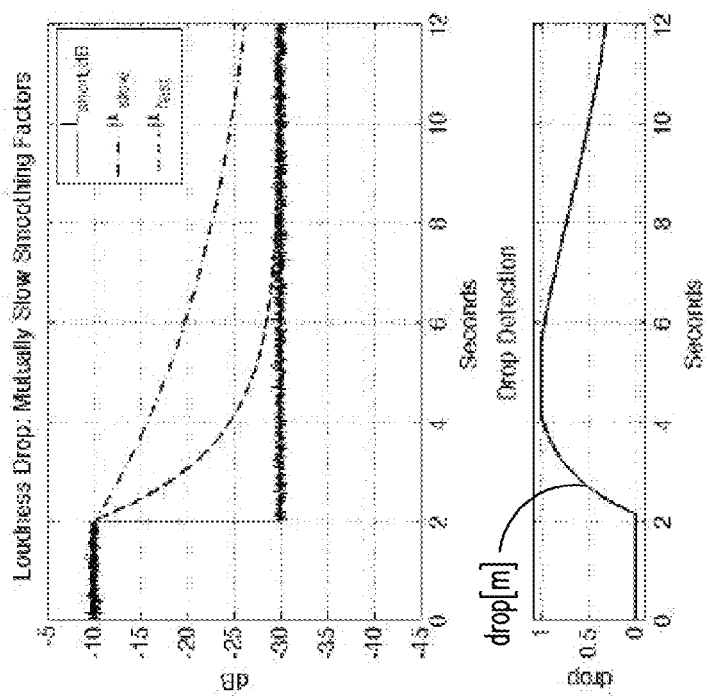

As previously described, mutually fast smoothing factors may not be optimal for highly dynamic signals due to a higher likelihood of false loudness drop detections. FIGS. 10C and 10D show the results of using mutually slower smoothing factors. The loudness drop detection signal drop [m] in FIG. 10C shows that for a signal containing a large long-term loudness drop, mutually slow smoothing factors may cause the loudness drop detection system 800 of FIG. 8 to not fully detect the loudness drop until approximately 4 seconds, as opposed to 2.5 seconds when using mutually fast smoothing factors. The loudness drop detection signal drop [m] in FIG. 10D shows that for a highly dynamic signal, the mutually slow smoothing factors enable the loudness drop detection system to accurately report an absence of long-term loudness drops.

It should be noted that, in the examples in FIGS. 10C and 10D, where mutually slow smoothing factors are used, the smoothing factor $\alpha_{fast}$ has been uniquely modified such that the attack speed remains relatively fast and only the release speed has been slowed; the attack and release speeds have both been slowed equally for smoothing factor $\alpha_{slow}$. Allowing independent fast attack and slow release speeds for $\alpha_{fast}$ may cause the smoothed result $\mu_{fast}$[m] to be biased towards the peaks of the loudness estimates, causing $\mu_{fast}$[m] to generally remain higher than $\mu_{slow}$[m]. This modification may improve the false loudness drop detection rate for highly dynamic content.

The above analysis suggests that a tradeoff exists in the tuning of the smoothing factor speeds of a loudness drop detection system. An improvement to a loudness drop detection system may be achieved by dynamically modifying the smoothing factor speeds so that they are slow during highly dynamic content (for example, in FIG. 10D) to limit false loudness drop detections and fast during less dynamic content to more quickly detect loudness drops (for example, in FIG. 10A). An example of a loudness drop detection system that dynamically modifies smoothing factors is described below.

Figure 11:
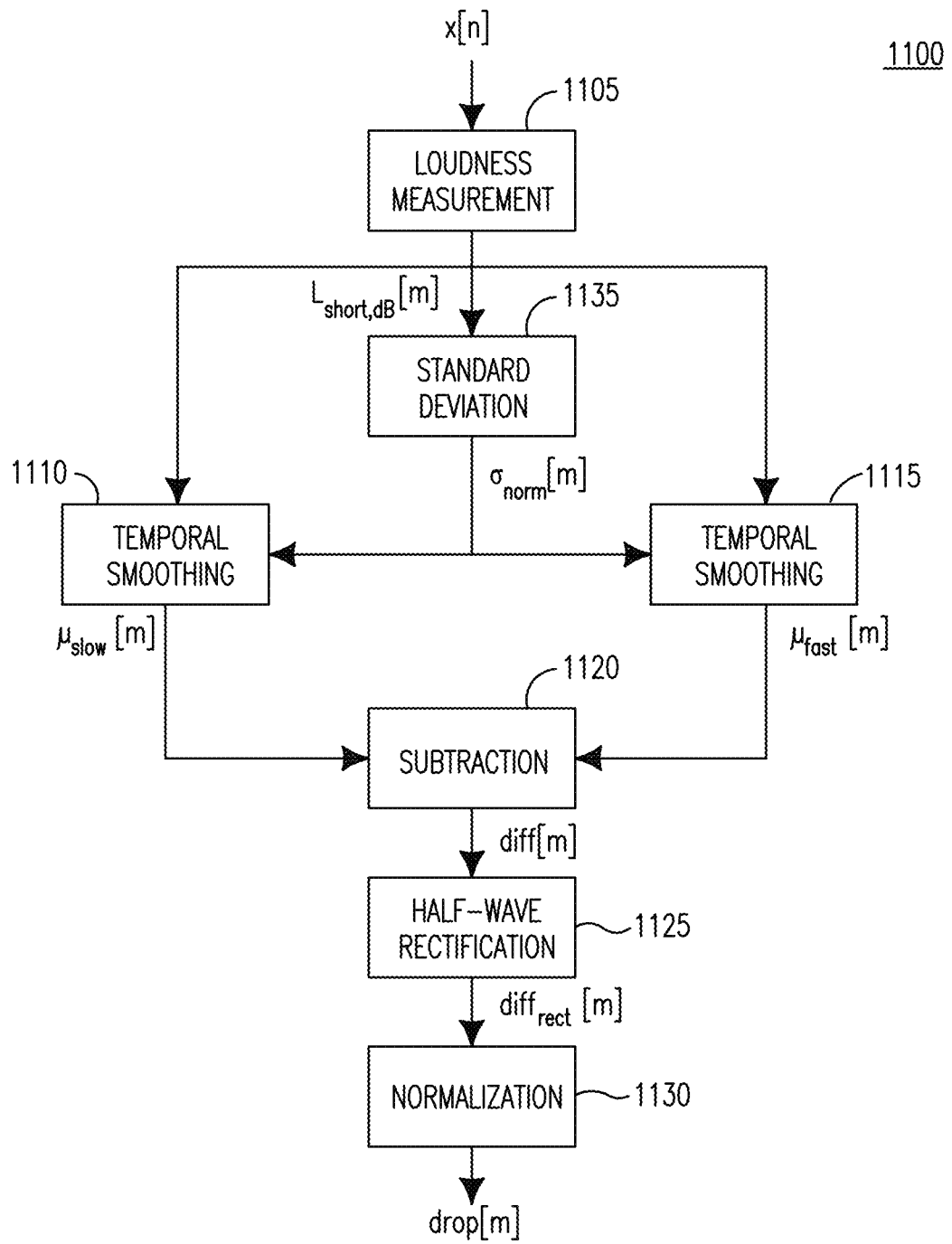
FIG. 11 shows a block diagram of a loudness drop detection system with dynamic smoothing factors, in accordance with an embodiment.

Dynamic smoothing factors may be incorporated into system 800 of FIG. 8 for improved loudness drop detection performance. FIG. 11 shows a block diagram of a loudness drop detection system 1100 with dynamic smoothing factors, in accordance with an embodiment. Specifically, FIG. 11 shows the integration of a standard deviation module 1135 into a loudness drop detection system 1100. The standard deviation module 1135 may provide an estimate of signal dynamics so that temporal smoothing components 1110 and 1115 may dynamically modify the $\alpha_{slow}$ and $\alpha_{fast}$ smoothing factors in a signal-dependent manner. The loudness drop detection system 1100 may also include a loudness measurement module 1105, a subtraction module 1120, a half-wave rectification module 1125, and a normalization module 1130.

The loudness drop detection system 1100 may receive an audio signal x[n], and may output a time-varying loudness drop detection estimate drop[m], indexed by m, such that drop[m] indicates whether or not a significant loudness level drop has occurred. The loudness drop detection estimate may be defined, for example, over the range [0, 1] where zero indicates an absence of loudness drops, one indicates that a large loudness drop has just occurred, and values in between are indicators of smaller or more moderate loudness drops. However, other drop detection values may be used. The loudness measurement module 1105, temporal smoothing components 1110 and 1115, subtraction module 1120, half-wave rectification module 1125, and normalization module 1130 may operate similarly to that described with respect to the loudness measurement module 805, temporal smoothing components 810 and 815, subtraction module 820, half-wave rectification module 825, and normalization module 830 described in FIG. 8.

As described previously, the relative behavior of the smoothed loudness estimates $\mu_{slow}[m]$ and $\mu_{fast}[m]$ ran may impact the frequency and extent of detected loudness drops. Accordingly, appropriate values for the smoothing factors $\alpha_{slow}$ and $\alpha_{fast}$ may be used to achieve suitable performance across different input signal types.

Signal dynamics may be estimated via the standard deviation module 1135 by calculating a modified standard deviation measure of the short-term loudness estimates. A loudness mean may be estimated by temporally smoothing the short-term loudness estimates $L_{short,dB}[m]$. The smoothing factor $\alpha_L$, which may be unique to Equation 42, may be chosen so that $\mu_L[m]$ approximates a desired mean window length:

$$\mu_L[m]=\mu_L[m-1]\cdot(1-\alpha_L)+L_{short,dB}[m]\cdot\alpha_L \quad \text{Equation 42}$$

A difference may be taken between the short-term loudness estimate and its estimated mean:

$$d[m]L_{short,dB}[m]-\mu_L[m] \quad \text{Equation 43}$$

This difference may be positive half-wave rectified and squared:

$$d_{rect}[m] = \begin{cases} d^2[m], & d[m] > 0 \\ 0, & d[m] \leq 0 \end{cases} \quad \text{Equation 44}$$

Half-wave rectification may not be part of a general standard deviation measure; however, it may be useful in differentiating between loudness drops and loudness increases. The difference signal d[m] may be negative during loudness drops, thus by applying positive half-wave rectification the resulting squared difference values may be based solely on loudness increases. By effectively removing loudness drops in this calculation, signals with low levels of short-term dynamics and possibly large long-term loudness drops (for example, the loudness drop seen in FIGS. 10A, and 10C) may result in low squared difference values $d_{rect}[m]$ while signals with high levels of short-term dynamics (for example, the signal seen in FIGS. 10B and 10D) may result in high squared difference values $d_{rect}[m]$.

The rectified and squared difference $d_{rect}[m]$ may be temporally smoothed with smoothing factor $\alpha_{std}$, which may be unique to Equation 45, and a square root may be taken producing an estimate of the standard deviation $\sigma[m]$ of the short-term loudness estimates:

$$\sigma[m]=\sqrt{\sigma^2[m-1]\cdot(1-\alpha_{std})+d_{rect}[m]\cdot\alpha_{std}} \quad \text{Equation 45}$$

The estimated standard deviation $\sigma[m]$ may then be normalized, for example, to the range [0, 1] using a method such as translation, scaling, and saturation as previously described hereinbefore for the calculation of drop[m].

In an example, the resulting normalized standard deviation $\sigma_{norm}[m]$ may be used to dynamically modulate the smoothing factors $\alpha_{slow}[m]$ and $\alpha_{fast}[m]$ in temporal smoothing components 1110 and 1115 respectively. For example, the smoothing factors $\alpha_{slow}[m]$ and $\alpha_{fast}[m]$ may be linearly interpolated between two predetermined smoothing factor speeds, a minimum speed and a maximum speed. As described previously, it may be desirable for the $\alpha_{slow}[m]$ smoothing factor to have equal attack and release speeds, so the $\alpha_{slow}[m]$ smoothing factor may be simply linearly interpolated between the minimum and maximum speeds:

$$\alpha_{slow}[m]=\alpha_{slow,max}\cdot(1-\sigma_{norm}[m])+\alpha_{slow,min}\cdot\sigma_{norm}[m] \quad \text{Equation 46}$$

where $\alpha_{slow,max}>\alpha_{slow,min}$, or in other words $\alpha_{slow\ max}$ is faster than $\alpha_{slow,min}$. When the standard deviation measure is high, for example when $\sigma_{norm}[m]=1$, $\alpha_{slow}[m]$ may be set to a slow value $\alpha_{slow,min}$. When the standard deviation measure is low, for example when $\sigma_{norm}[m]=0$, $\alpha_{slow}[m]$ may be set to a fast value $\alpha_{slow,max}$. When the standard deviation measure is somewhere in between, for example when $0<\sigma_{norm}[m]<1$, $\alpha_{slow}[m]$ may be linearly interpolated between the minimum and maximum speeds.

As described previously, performance may be improved when the attack and release speeds of the $\alpha_{fast}[m]$ smoothing factor are calculated independently such that the attack factor remains fast while the release factor is linearly interpolated between the minimum and maximum speeds based on the normalized standard deviation:

$$\alpha_{fast}[m] = \begin{cases} \alpha_{fast,max} & L_{short,dB}[m] > \mu_{fast}[m-1] \\ \alpha_{fast,max}\cdot(1-\sigma_{norm}[m])+ \\ \quad \alpha_{fast,min}\cdot\sigma_{norm}[m], & \text{otherwise} \end{cases} \quad \text{Equation 47}$$

where $\alpha_{fast,max}$ and $\alpha_{fast,min}$ are predetermined smoothing factors and $\alpha_{fast,max}>\alpha_{fast,min}$, or in other words $\alpha_{fast,max}$ is faster than $\alpha_{fast,min}$.

Figures 12A, 12B:
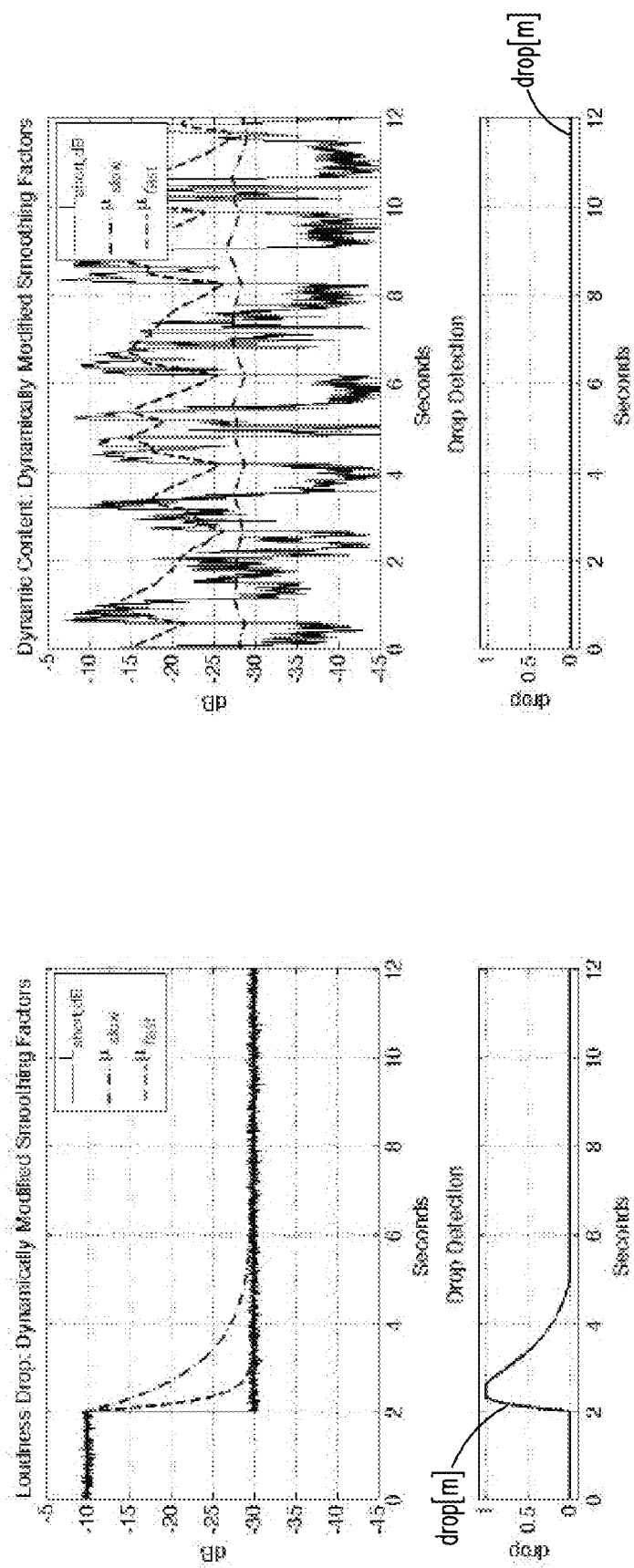
FIGS. 12A and 12B each show examples of the short-term loudness estimate, the smoothed filter outputs, and the loudness drop detection signal, with dynamic smoothing factors in a loudness drop detection system.

FIGS. 12A and 12B show example results of applying these dynamic smoothing factor modifications. Similar to FIG. 9 and FIGS. 10A-10D, FIGS. 12A and 12B show the short-term loudness estimate $L_{short,dB}[m]$ (solid), the two smoothed filter outputs $\mu_{slow}[m]$ (dash-dot) and $\mu_{fast}[m]$ (dash), and the loudness drop detection signal drop[m] (lower plot), for a loudness drop detection system, such as loudness drop detection system 1100 of FIG. 11. The loudness drop detection signal drop[m] in FIG. 12A shows an accurate detection occurring within 0.5 seconds of the true loudness drop. The loudness drop detection signal drop[m] in FIG. 12B shows an absence of false detections during short-term signal dynamics. FIGS. 12A and 12B illustrate the improvements that may be made by using signal-dependent dynamic smoothing factors over the static smoothing factors seen in FIGS. 10A-10D.

Figure 13:
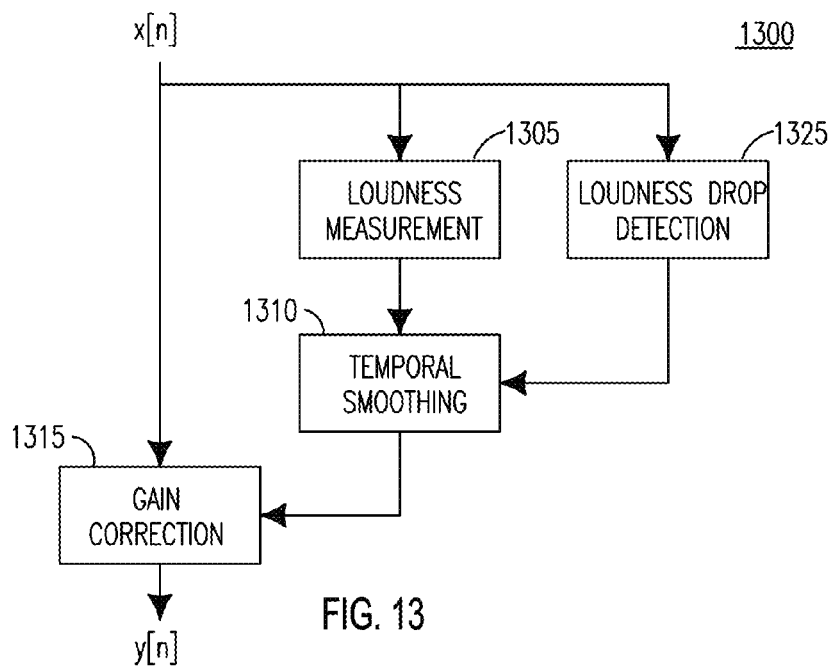
FIG. 13 shows a block diagram of a loudness control system with loudness drop detection, in accordance with an embodiment.

The loudness drop detection systems 800 of FIGS. 8 and 1100 of FIG. 11 may be integrated into a loudness control system, such as loudness control system 200 illustrated in FIG. 2. FIG. 13 illustrates a high-level block diagram of a loudness control system 1300 with a loudness drop detection module 1325, such as the loudness drop detection systems 800 described in FIG. 8 or 1100 described in FIG. 11.

The loudness control system 1300 may include a loudness measurement module 1305, a loudness drop detection module 1325, a temporal smoothing module 1310, and a gain correction module 1315. The loudness measurement module 1305 and the gain correction module 1315 may operate similarly to that described with respect to the loudness measurement module 205 and the gain correction module 215 described in FIG. 2.

As described with respect to the loudness control system 200 of FIG. 2, a temporal smoothing module 1310 may be equipped with separate "attack" and "release" smoothing factors. The release smoothing factor $\alpha_{release}$ may control the speed at which the loudness control is allowed to increase its gain level. Fast $\alpha_{release}$ values may allow the loudness control to quickly increase gain levels, while slow $\alpha_{release}$ values may constrain the speed at which gain levels are allowed to increase.

A simple loudness control system may set the $\alpha_{release}$ smoothing factor to a signal-independent predetermined value chosen to balance inter- and intra-content dynamics, compromising optimal performance. By integrating loudness drop detection, a loudness control system can dynamically modify the $\alpha_{release}[m]$ smoothing factor so that both inter- and intra-content dynamics are addressed appropriately. During an absence of loudness drop detections, for example when drop[m]=0, $\alpha_{release}[m]$ may be set to a predetermined default value $\alpha_{release,def}$ that maintains intra-content dynamics. When a loudness drop is detected, for example when drop[m]=1, the value may be sped up to a predetermined value $\alpha_{release,max}$ that allows for quick increases in gain levels, for example during inter-content transitions. During partial drop detections, for example when 0<drop[m]<1, the $\alpha_{release}[m]$ value may be linearly interpolated between the extremes:

$$\alpha_{release}[m]=\alpha_{release,def}(1-\text{drop}[m])+ \alpha_{release,max}\cdot\text{drop}[m] \quad \text{Equation 48}$$

Larger drops in loudness, with higher loudness drop detection values, may result in faster gain recovery than smaller drops. This may help alleviate noticeable "ramping" artifacts by shortening the duration of the ramp.

Recovery from loudness drops may also be achieved by recovering from a wide range of loudness drops in a fixed amount of time. By way of example, it may be desired that recovery from loudness drops occurs within three seconds regardless of the extent of the loudness drops. Using an estimate of the loudness drop, a suitable $\alpha_{release}[m]$ smoothing factor may be calculated that will ensure recovery within this amount of time independent of the extent of the loudness drop.

Figure 14:
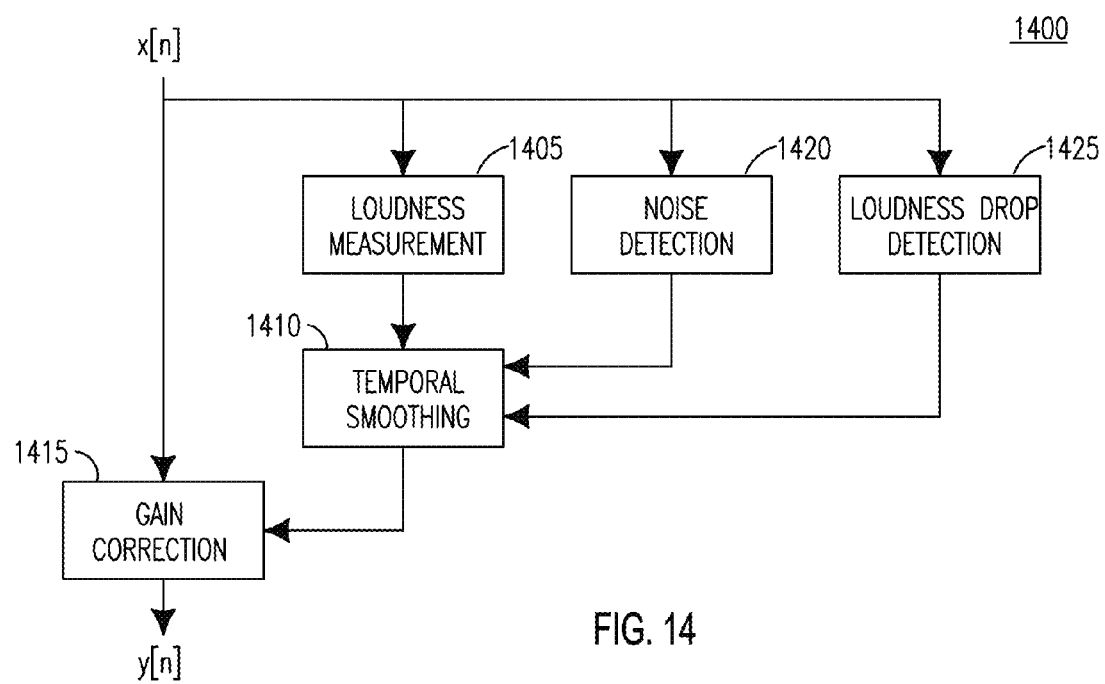
FIG. 14 shows a block diagram of a loudness control system with noise detection and loudness drop detection, in accordance with an embodiment.

According to another embodiment, both a noise detection system, such as system 300 of FIG. 3 or system 500 of FIG. 5, and a loudness drop detection system, such as system 800 of FIG. 8 or system 1100 of FIG. 11, may be integrated into a loudness control system, such as system 200 of FIG. 2. FIG. 14 shows a block diagram of a loudness control system 1400 with noise detection and loudness drop detection, in accordance with an embodiment.

The loudness control system 1400 may include a loudness measurement module 1405, a noise detection module 1420, a loudness drop detection module 1425, a temporal smoothing module 1410, and a gain correction module 1415. The loudness measurement module 1405 and the gain correction module 1415 may operate similarly to that described with respect to the loudness measurement module 205 and the gain correction module 215 described in FIG. 2. The noise detection module 1420 may operate similarly to that described with respect to the frequency noise detection system 300 described in FIG. 3 or 500 described in FIG. 5. The loudness drop detection module 1425 may operate similarly to that described with respect to the loudness drop detection system 800 described in FIG. 8 or 1100 described in FIG. 11.

The temporal smoothing module 1410 may operate similarly to that described with respect to the temporal smoothing module 710 described in FIGS. 7 and 1310 described in FIG. 13. Temporal smoothing module 1410 may receive content-versus-noise classification values that may slow the smoothing factors as described in the discussion of FIG. 7, and may also receive loudness drop detection values that may increase the speed of the smoothing factors as described in the discussion of FIG. 13. The decision to slow the smoothing factors based on the content-versus-noise classification, or increase the speed of the smoothing factors based on the loudness drop detection, or calculate a new speed via a combination of the two is a decision involving numerous tradeoffs and may be application specific. In an embodiment, the release smoothing factor $\alpha_{release}[m]$ in the temporal smoothing module 1410 may be dynamically modified by a linear combination of the content-versus-noise classification values and the loudness drop detection values via an average of the results from Equations 35 and 48, as follows:

$$\alpha_{release}[m] = \frac{\alpha_{release,def} \cdot (\text{class}[m] + 1 - \text{drop}[m]) + \alpha_{release,max} \cdot \text{drop}[m]}{2} \quad \text{Equation 49}$$

Although features and elements are described above in particular combinations, one of ordinary skill in the art will appreciate that each feature or element can be used alone or in any combination with the other features and elements. Any of the features and elements described herein may be implemented as separate modules or any set or subset of features may be combined and implemented on a common programmable module.

In addition, the systems and methods described herein may be implemented in hardware, a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A loudness control system configured to process an audio signal, the loudness control system comprising:
   a loudness measurement circuit configured to generate a short-term loudness estimate of the audio signal, wherein the audio signal includes content and noise;
   a noise detection circuit configured to produce a content-versus-noise classification of the audio signal indicating whether the audio signal is more likely to be content or more likely to be noise;
   a temporal smoothing circuit configured to adjust at least one smoothing factor based on the content-versus-noise classification to control a speed at which a gain correction circuit can increase a time-varying gain, and generate a long-term loudness estimate of the audio signal based on the short-term loudness estimate using the at least one smoothing factor; and
   the gain correction circuit configured to apply the time-varying gain to the audio signal based on the long-term loudness estimate.

2. The loudness control system of claim 1, wherein:
   the noise detection circuit is configured to use frequency domain noise detection to produce the content-versus-noise classification.

3. The loudness control system of claim 1, wherein:
   the noise detection circuit is configured to use time domain noise detection to produce the content-versus-noise classification.

4. The loudness control system of claim 1, wherein:
   the at least one smoothing factor includes a release smoothing factor.

5. The loudness control system of claim 1 further comprising:
   a loudness drop detection circuit configured to generate a loudness drop detection value;
   wherein the temporal smoothing circuit is further configured to adjust the at least one smoothing factor based on the loudness drop detection value.

6. A loudness control system configured to process an audio signal, the loudness control system comprising:
   a loudness measurement circuit configured to generate a short-term loudness estimate of the audio signal, wherein the audio signal includes content and noise;
   a loudness drop detection circuit configured to generate a loudness drop detection value based in part on a slow smoothed loudness estimate of the loudness estimate of the audio signal and fast smoothed loudness estimate of the loudness estimate of the audio signal;
   a temporal smoothing circuit configured to adjust at least one smoothing factor based on the loudness drop detection value to control a speed at which a gain correction circuit can increase a time-varying gain, and generate a long-term loudness estimate of the audio signal based on the short-term loudness estimate using the at least one smoothing factor; and
   the gain correction circuit configured to apply the time-varying gain to the audio signal based on the long-term loudness estimate.

7. The loudness control system of claim 6, wherein:
   the at least one smoothing factor includes a release smoothing factor.

8. The loudness control system of claim 6 further comprising:
   a noise detection circuit configured to produce a content-versus-noise classification of the audio signal;
   wherein the temporal smoothing circuit is further configured to adjust the at least one smoothing factor based on the content-versus-noise classification.

9. A method for processing an audio signal, performed by a loudness control system, the method comprising:
   generating a short-term loudness estimate of the audio signal, wherein the audio signal includes content and noise;
   producing a content-versus-noise classification of the audio signal indicating whether the audio signal is more likely to be content or more likely to be noise;
   adjusting at least one smoothing factor based on the content-versus-noise classification to control a speed at which a gain correction circuit can increase a time-varying gain, and generating a long-term loudness estimate of the audio signal based on the short-term loudness estimate using the at least one smoothing factor; and
   applying the time-varying gain to the audio signal based on the long-term loudness estimate.

10. The method of claim 9, wherein:
    the producing the content-versus-noise classification uses frequency domain noise detection.

11. The method of claim 9, wherein:
    the producing the content-versus-noise classification uses time domain noise detection.

12. The method of claim 9, wherein:
    the at least one smoothing factor includes a release smoothing factor.

13. The method of claim 9 further comprising:
    generating a loudness drop detection value; and
    adjusting the at least one smoothing factor based on the loudness drop detection value.

14. A method for processing an audio signal, performed by a loudness control system, the method comprising:
    generating a short-term loudness estimate of the audio signal, wherein the audio signal includes content and noise;
    generating a loudness drop detection value based in part on a slow smoothed loudness estimate of the loudness estimate of the audio signal and fast smoothed loudness estimate of the loudness estimate of the audio signal;
    adjusting at least one smoothing factor based on the loudness drop detection value to control a speed at which a gain correction circuit can increase a time-varying gain, and generating a long-term loudness estimate of the audio signal based on the short-term loudness estimate using the at least one smoothing factor; and
    applying the time-varying gain to the audio signal based on the long-term loudness estimate.

15. The method of claim 14, wherein:
    the at least one smoothing factor includes a release smoothing factor.

16. The method of claim 14 further comprising:
    producing a content-versus-noise classification of the audio signal; and
    adjusting the at least one smoothing factor based on the content-versus-noise classification.

* * * * *